United States Patent [19]
Tamba et al.

[11] Patent Number: 6,130,577
[45] Date of Patent: Oct. 10, 2000

[54] DIGITAL DEMODULATORS FOR PHASE MODULATED AND AMPLITUDE-PHASE MODULATED SIGNALS

[75] Inventors: Yuko Tamba, Ome; Taiji Kondou, Tachikawa; Katsuhiro Furukawa, Ome, all of Japan; Yukihito Ishihara, Maidenhead, United Kingdom

[73] Assignees: Hitachi, Ltd., Tokyo; Hitachi Tohbu Semiconductor, Ltd., Saitama, both of Japan

[21] Appl. No.: 08/973,899

[22] PCT Filed: Jun. 11, 1996

[86] PCT No.: PCT/JP96/01573

§ 371 Date: Apr. 2, 1998

§ 102(e) Date: Apr. 2, 1998

[87] PCT Pub. No.: WO97/01908

PCT Pub. Date: Jan. 16, 1997

[30] Foreign Application Priority Data

Jun. 26, 1995 [JP] Japan ..................... 7-159477

[51] Int. Cl.[7] ............... H04L 27/22; H04L 27/38
[52] U.S. Cl. ............ 329/304; 329/306; 329/310; 375/324; 375/329
[58] Field of Search .................... 329/304, 306, 329/310; 375/324, 329

[56] References Cited

FOREIGN PATENT DOCUMENTS

| 2-284547 | 11/1990 | Japan . |
| 4-68841 | 3/1992 | Japan . |
| 6-244888 | 9/1994 | Japan . |
| 6-311191 | 11/1994 | Japan . |
| 7-58792 | 3/1995 | Japan . |

OTHER PUBLICATIONS

Sep. 12, 1994 issue of Nikkei Electronics (No. 617), published by Nikkei BP Co., Ltd., pp. 71–96, Special Edition: Technologies for Implementing Portable Telephones in Competition for Lightness and Low Costs.

*Primary Examiner*—Siegfried H. Grimm
*Attorney, Agent, or Firm*—Beall Law Offices

[57] ABSTRACT

In a digital demodulator for phase modulated signals, logical values of a waveform-shaped phase-modulated signal are sampled based on a clock signal having a period that stands in integer ratio relationship to a carrier period of the modulated signal and thereafter subjected to serial/parallel conversion for each predetermined interval, whereby a logical pattern of a digital code train subjected to the serial/parallel conversion is analyzed. As a result, phase information required to demodulate digital data can be logically detected.

19 Claims, 22 Drawing Sheets

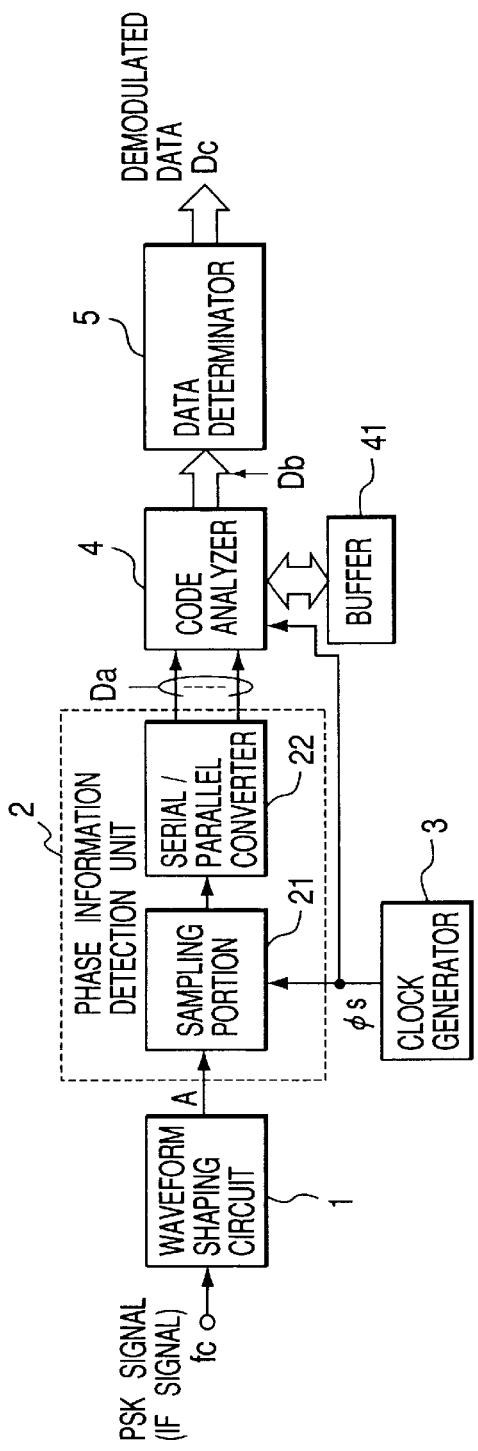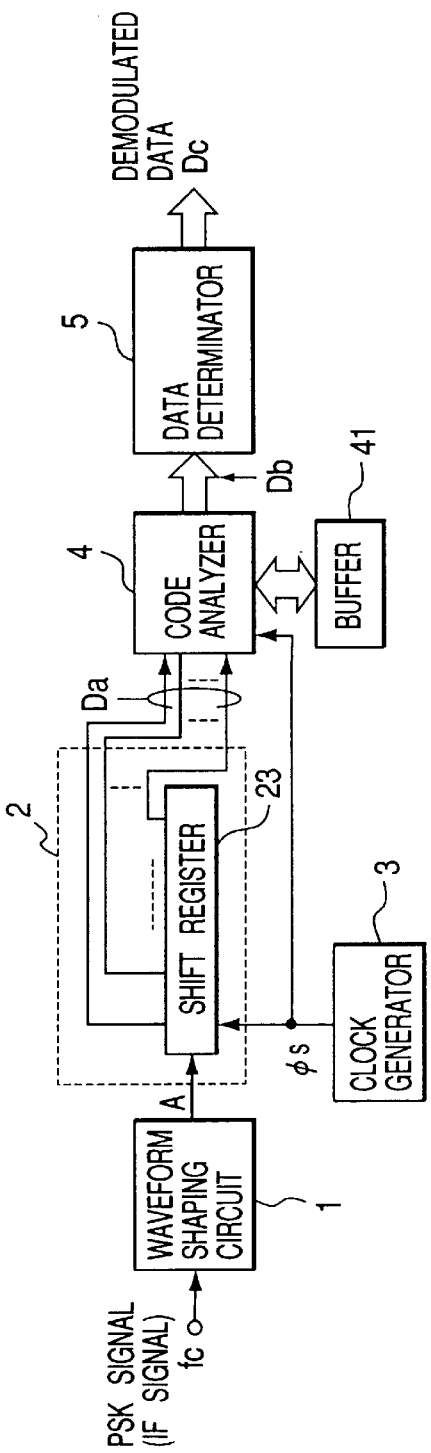

| INPUT SIGNAL | SHIFT REGISTER OUPTUT (F1~F8) | | | | | | | |
|---|---|---|---|---|---|---|---|---|
| | d1 | d2 | d3 | d4 | d5 | d6 | d7 | d8 |
| a | 1 | 1 | 1 | 1 | 0 | 0 | 0 | 0 |
| b | 0 | 1 | 1 | 1 | 1 | 0 | 0 | 0 |
| c | 0 | 0 | 1 | 1 | 1 | 1 | 0 | 0 |
| d | 0 | 0 | 0 | 1 | 1 | 1 | 1 | 0 |
| e | 0 | 0 | 0 | 0 | 1 | 1 | 1 | 1 |
| f | 1 | 0 | 0 | 0 | 0 | 1 | 1 | 1 |
| g | 1 | 1 | 0 | 0 | 0 | 0 | 1 | 1 |
| h | 1 | 1 | 1 | 0 | 0 | 0 | 0 | 1 |

| INPUT SIGNAL | REGISTER OUTPUT (SR1~SR4) | | | | | | | | | | | | | | | |
|---|---|---|---|---|---|---|---|---|---|---|---|---|---|---|---|---|
| | SR1 ($\phi 1$) | | | | SR2 ($\phi 2$) | | | | SR3 ($\phi 3$) | | | | SR4 ($\phi 4$) | | | |
| | d11 | d12 | d13 | d14 | d21 | d22 | d23 | d24 | d31 | d32 | d33 | d34 | d41 | d42 | d43 | d44 |
| a | 1 | 1 | 0 | 0 | 1 | 0 | 0 | 1 | 0 | 0 | 1 | 1 | 0 | 1 | 1 | 0 |
| b | 0 | 1 | 1 | 0 | 1 | 0 | 0 | 1 | 0 | 0 | 1 | 1 | 0 | 1 | 1 | 0 |
| c | 0 | 1 | 1 | 0 | 1 | 1 | 0 | 0 | 0 | 0 | 1 | 1 | 0 | 1 | 1 | 0 |
| d | 0 | 1 | 1 | 0 | 1 | 1 | 0 | 0 | 1 | 0 | 0 | 1 | 0 | 1 | 1 | 0 |
| e | 0 | 1 | 1 | 0 | 1 | 1 | 0 | 0 | 1 | 0 | 0 | 1 | 0 | 0 | 1 | 1 |
| f | 0 | 0 | 1 | 1 | 1 | 1 | 0 | 0 | 1 | 0 | 0 | 1 | 0 | 0 | 1 | 1 |
| g | 0 | 0 | 1 | 1 | 0 | 1 | 1 | 0 | 1 | 0 | 0 | 1 | 0 | 0 | 1 | 1 |
| h | 0 | 0 | 1 | 1 | 0 | 1 | 1 | 0 | 1 | 1 | 0 | 0 | 0 | 0 | 1 | 1 |
| i | 0 | 0 | 1 | 1 | 0 | 1 | 1 | 0 | 1 | 1 | 0 | 0 | 1 | 0 | 0 | 1 |
| j | 1 | 0 | 0 | 1 | 0 | 1 | 1 | 0 | 1 | 1 | 0 | 0 | 1 | 0 | 0 | 1 |
| k | 1 | 0 | 0 | 1 | 0 | 0 | 1 | 1 | 1 | 1 | 0 | 0 | 1 | 0 | 0 | 1 |
| l | 1 | 0 | 0 | 1 | 0 | 0 | 1 | 1 | 0 | 1 | 1 | 0 | 1 | 0 | 0 | 1 |
| m | 1 | 0 | 0 | 1 | 0 | 0 | 1 | 1 | 0 | 1 | 1 | 0 | 1 | 1 | 0 | 0 |
| n | 1 | 1 | 0 | 0 | 0 | 0 | 1 | 1 | 0 | 1 | 1 | 0 | 1 | 1 | 0 | 0 |
| o | 1 | 1 | 0 | 0 | 1 | 0 | 0 | 1 | 0 | 1 | 1 | 0 | 1 | 1 | 0 | 0 |
| p | 1 | 1 | 0 | 0 | 1 | 0 | 0 | 1 | 0 | 0 | 1 | 1 | 1 | 1 | 0 | 0 |

FIG. 11

| REGISTER OUTPUT PATTERN (SR1~SR4) | | | | | LOGICAL PATTERN | PHASE INFORMATION OF INPUT SIGNAL | |
|---|---|---|---|---|---|---|---|
| INPUT SIGNAL | SR1 | SR2 | SR3 | SR4 | | RELATIVE PHASE | PHASE VALUE |
| a | A | D | C | B | ADCB | 0 | $+8\pi/8$ |
| b | B | D | C | B | BDCB | $\pi/8$ | $+7\pi/8$ |
| c | B | A | C | B | BACB | $2\pi/8$ | $+6\pi/8$ |
| d | B | A | D | B | BADB | $3\pi/8$ | $+5\pi/8$ |
| e | B | A | D | C | BADC | $4\pi/8$ | $+4\pi/8$ |
| f | C | A | D | C | CADC | $5\pi/8$ | $+3\pi/8$ |
| g | C | B | D | C | CBDC | $6\pi/8$ | $+2\pi/8$ |
| h | C | B | A | C | CBAC | $7\pi/8$ | $+\pi/8$ |
| i | C | B | A | D | CBAD | $8\pi/8$ | 0 |
| j | D | B | A | D | DBAD | $9\pi/8$ | $-\pi/8$ |
| k | D | C | A | D | DCAD | $10\pi/8$ | $-2\pi/8$ |
| l | D | C | B | D | DCBD | $11\pi/8$ | $-3\pi/8$ |
| m | D | C | B | A | DCBA | $12\pi/8$ | $-4\pi/8$ |
| n | A | C | B | A | ACBA | $13\pi/8$ | $-5\pi/8$ |
| o | A | D | B | A | ADBA | $14\pi/8$ | $-6\pi/8$ |
| p | A | D | C | A | ADCA | $15\pi/8$ | $-7\pi/8$ |

A = 1100
B = 0110
C = 0011
A = 1001

SHIFT REGISTER OUTPUT AT SAMPLING INTERVAL T1

| DIVIDED-BY- | SHIFT REGISTER OUTPUT A (F1~F2) | | | | | | | | | | | | | | | |
|---|---|---|---|---|---|---|---|---|---|---|---|---|---|---|---|---|
| 1/2 | SR11 | | SR21 | | SR12 | | SR22 | | SR13 | | SR23 | | SR14 | | SR24 | |
| INPUT SIGNAL | d11 | d12 | d11 | d12 | d21 | d22 | d21 | d22 | d31 | d32 | d31 | d32 | d41 | d42 | d41 | d42 |
| a1 | 1 | 1 | | | 1 | 0 | | | 0 | 0 | | | 0 | 1 | | |
| a2 | | | 0 | 1 | | | 1 | 1 | | | 1 | 0 | | | 0 | 1 |
| b1 | 0 | 1 | | | 1 | 1 | | | 0 | 0 | | | 0 | 1 | | |
| b2 | | | 0 | 0 | | | 1 | 1 | | | 1 | 0 | | | 0 | 0 |
| c1 | 0 | 1 | | | 1 | 1 | | | 1 | 0 | | | 0 | 0 | | |
| c2 | | | 0 | 0 | | | 0 | 1 | | | 1 | 1 | | | 0 | 0 |
| d1 | 0 | 0 | | | 0 | 1 | | | 1 | 0 | | | 0 | 0 | | |
| d2 | | | 1 | 0 | | | 0 | 1 | | | 1 | 1 | | | 1 | 0 |
| e1 | 0 | 0 | | | 0 | 1 | | | 1 | 1 | | | 1 | 0 | | |
| e2 | | | 1 | 0 | | | 0 | 0 | | | 0 | 1 | | | 1 | 0 |
| f1 | 1 | 0 | | | 0 | 0 | | | 1 | 1 | | | 1 | 0 | | |
| f2 | | | 1 | 1 | | | 0 | 0 | | | 0 | 1 | | | 1 | 1 |
| g1 | 1 | 0 | | | 0 | 0 | | | 0 | 1 | | | 1 | 1 | | |
| g2 | | | 1 | 1 | | | 1 | 0 | | | 0 | 0 | | | 1 | 1 |
| h1 | 1 | 1 | | | 1 | 0 | | | 0 | 1 | | | 1 | 1 | | |
| h2 | | | 0 | 1 | | | 1 | 0 | | | 0 | 0 | | | 0 | 1 |

FIG. 16

SHIFT REGISTER OUTPUT AT SAMPLING INTERVAL T2

| DIVIDED-BY-1/2 INPUT SIGNAL | SHIFT REGISTER OUTPUT B (F1~F2) | | | | | | | | | | | | | | | |
|---|---|---|---|---|---|---|---|---|---|---|---|---|---|---|---|---|
| | SR11 | | SR21 | | SR12 | | SR22 | | SR13 | | SR23 | | SR14 | | SR24 | |
| | d11 | d12 | d11 | d12 | d21 | d22 | d21 | d22 | d31 | d32 | d31 | d32 | d41 | d42 | d41 | d42 |
| a1 | 0 | 0 | | | 0 | 1 | | | 1 | 1 | | | 1 | 0 | | |
| a2 | | | 1 | 0 | | | 0 | 0 | | | 0 | 1 | | | 1 | 0 |
| b1 | 1 | 0 | | | 0 | 0 | | | 1 | 1 | | | 1 | 0 | | |
| b2 | | | 1 | 1 | | | 0 | 0 | | | 0 | 1 | | | 1 | 1 |
| c1 | 1 | 0 | | | 0 | 0 | | | 0 | 1 | | | 1 | 1 | | |
| c2 | | | 1 | 1 | | | 1 | 0 | | | 0 | 0 | | | 1 | 1 |
| d1 | 1 | 1 | | | 1 | 0 | | | 0 | 1 | | | 1 | 1 | | |
| d2 | | | 0 | 1 | | | 1 | 0 | | | 0 | 0 | | | 0 | 1 |
| e1 | 1 | 1 | | | 1 | 0 | | | 0 | 0 | | | 0 | 1 | | |
| e2 | | | 0 | 1 | | | 1 | 1 | | | 1 | 0 | | | 0 | 1 |
| f1 | 0 | 1 | | | 1 | 1 | | | 0 | 0 | | | 0 | 1 | | |
| f2 | | | 0 | 0 | | | 1 | 1 | | | 1 | 0 | | | 0 | 0 |
| g1 | 0 | 1 | | | 1 | 1 | | | 1 | 0 | | | 0 | 0 | | |
| g2 | | | 0 | 0 | | | 0 | 1 | | | 1 | 1 | | | 0 | 0 |
| h1 | 0 | 0 | | | 0 | 1 | | | 1 | 0 | | | 0 | 0 | | |
| h2 | | | 1 | 0 | | | 0 | 1 | | | 1 | 1 | | | 1 | 0 |

FIG. 17

| DIVIDED-BY-1/2 SIGNAL | | SHIFT REGISTER OUTPUT (F1~F2) | | | | | | | | PHASE INFORMATION | |
|---|---|---|---|---|---|---|---|---|---|---|---|
| | | SR11~14 (a1~h1) | | | | SR21~24 (a2~h2) | | | | RELATIVE PHASE | PHASE VALUE |
| T1 | a1 / a2 | 3 | 2 | 0 | 1 | 1 | 3 | 2 | 1 | 0 | $+\pi$ |
| T2 | a1 / a2 | 0 | 1 | 3 | 2 | 2 | 0 | 1 | 2 | | |
| T1 | b1 / b2 | 1 | 3 | 0 | 1 | 0 | 3 | 2 | 0 | $\pi/4$ | $+3\pi/4$ |
| T2 | b1 / b2 | 2 | 0 | 3 | 2 | 3 | 0 | 1 | 3 | | |
| T1 | c1 / c2 | 1 | 3 | 2 | 0 | 0 | 1 | 3 | 0 | $2\pi/4$ | $+2\pi/4$ |
| T2 | c1 / c2 | 2 | 0 | 1 | 3 | 3 | 2 | 0 | 3 | | |
| T1 | d1 / d2 | 0 | 1 | 2 | 0 | 2 | 1 | 3 | 2 | $3\pi/4$ | $+\pi/4$ |
| T2 | d1 / d2 | 3 | 2 | 1 | 3 | 1 | 2 | 0 | 1 | | |
| T1 | e1 / e2 | 0 | 1 | 3 | 2 | 2 | 0 | 1 | 2 | $4\pi/4$ | 0 |
| T2 | e1 / e2 | 3 | 2 | 0 | 1 | 1 | 3 | 2 | 1 | | |
| T1 | f1 / f2 | 2 | 0 | 3 | 2 | 3 | 0 | 1 | 3 | $5\pi/4$ | $-\pi/4$ |
| T2 | f1 / f2 | 1 | 3 | 0 | 1 | 0 | 3 | 2 | 0 | | |
| T1 | g1 / g2 | 2 | 0 | 1 | 3 | 3 | 2 | 0 | 3 | $6\pi/4$ | $-2\pi/4$ |
| T2 | g1 / g2 | 1 | 3 | 2 | 0 | 0 | 1 | 3 | 0 | | |
| T1 | h1 / h2 | 3 | 2 | 1 | 3 | 1 | 2 | 0 | 1 | $7\pi/4$ | $-3\pi/4$ |
| T2 | h1 / h2 | 0 | 1 | 2 | 0 | 2 | 1 | 3 | 2 | | |

0 = 00
1 = 01
2 = 10
3 = 11

PHASE-MODULATION

PHASE-AMPLITUDE MODULATION

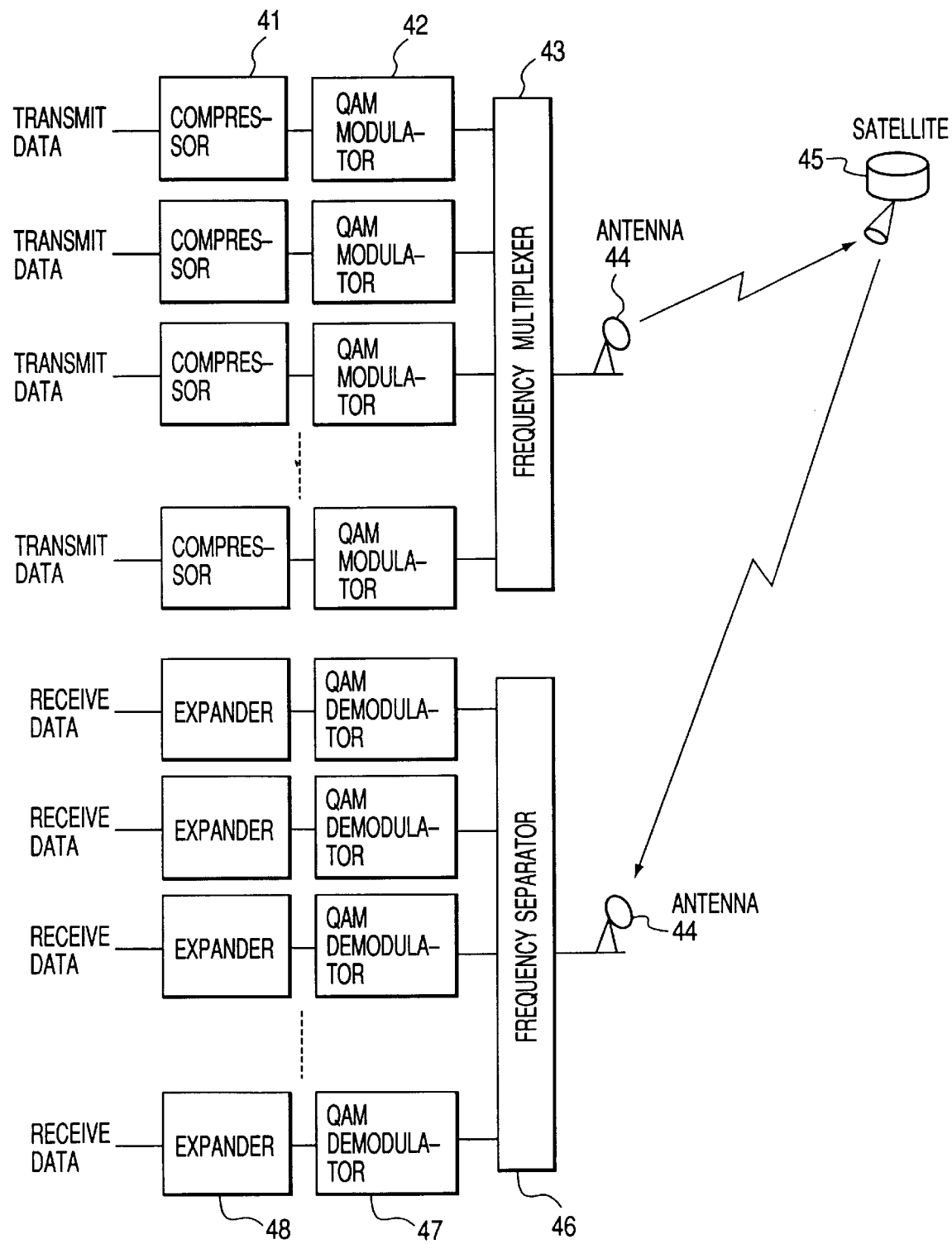

DIGITAL DEMODULATORS FOR PHASE MODULATED AND AMPLITUDE-PHASE MODULATED SIGNALS

TECHNICAL FIELD

The present invention relates to a demodulator and a technique effective for use in a process for digitally demodulating a phase-modulated signal and a process for digitally demodulating an amplitude phase-modulated signal. The present invention relates to a technique effective for use in mobile communication devices such as a PDC (Personal Digital Cellular System), a PHS (Personal Handyphone System), etc. or satellite communications.

BACKGROUND ART

In mobile communication devices such as a PDC, a PHS, etc., an audio or speech signal is converted into digital data on the transmitting side and a carrier is modulated by the digital data and transmitted by radio. On the receiving side, the digital data is demodulated from the received modulated signal and the original audio signal is reproduced from the demodulated digital data (see, for example, "The Sep. 12, 1994 issue of Nikkei Electronics (no. 617)" published by Nikkei BP Co., Ltd., pp 71–96 <Special Edition: Mounting Technology of Portable Telephones Competing with one another in Less Weight and Low Price>).

As a digital data modulating system, a kind of phase modulation (PSK modulation) is mostly utilized which associates the value of each digital data with a displacement or shift in the phase of a carrier. In QPSK modulation, four types of phase shifts (0, π/2, π, 3π/2) corresponding to four kinds of binary logical data of "00", "01", "10", "11" are effected on the carrier. On the demodulating side, the phase shift in the carrier is detected for each predetermined interval and binary logical data associated with the detected phase shift is reproduced.

In digital communications, an amplitude phase modulation system is also used which causes both the phase and amplitude of a carrier to hold information for effective use of the frequency. As a system for demodulating the amplitude phase-modulated signal, a method of orthogonally detecting a received signal and thereafter identifying a phase component and amplitude thereof, a method of identifying a phase component by orthogonal or rectangular detection and identifying an amplitude component by envelope detection, etc. are known (see Japanese Patent Application Laid-Open No. 6-244888 and the like).

The aforementioned process for demodulating the phase-modulated signal has heretofore been executed using analog circuits such as a lowpass filter, a delay detector, etc., whereas the process for demodulating the amplitude phase-modulated signal has heretofore been performed using analog circuits such as a local oscillator for orthogonal detection, a multiplier, an envelop detector, etc. Since, however, the analog circuits are hard to be brought into semiconductor integration as compared with digital circuits, and the effect of reducing a chip area by process miniaturization and the stability of performance are also deteriorated, some or all of the analog circuits have been replaced with digital circuits in recent years. The replacement of the analog circuits with the digital circuits allows an improvement in the degree of integration of a semiconductor integrated circuit. Thus, a reduction in the number of parts, less size and weight of a device, the suitability for mass production, and the stability and reproducibility of performance, etc. are to be expected.

It has however been definitely shown by the present inventor et al. that the aforementioned technique involves the following problems.

That is, the function of the conventional analog circuit has been replaced by that of the digital circuit as it is in the phase demodulator using the conventional digital circuits. The demodulation processing system itself still remains in the realm of simple digital simulation of the operation of each analog circuit. Described specifically, an A/D converter is placed on the input side and a phase-modulated signal digitized (quantized) by the A/D converter is electrically processed by a digitized lowpass filter and a digitized delay detector or the like. Thus, the degree of integration of the semiconductor integrated circuit can be enhanced even by the circuit replacement that the digital circuit simply follows the system using the analog circuits as it is.

However, the digital process for simulating the operation of the analog circuit as it is makes it to increase the amount of data to be handled. Further, the processing of the data referred to above also results in an increase in the number of manhours and high complexity. As the A/D converter used for digitizing the phase-modulated signal, one is needed which is as fast as possible in speed and high in resolution. However, the high-speed and high-resolution A/D converter encounters many difficulties in its manufacturing and is extremely high in cost.

Digitizing the phase demodulator makes it so effective in enhancing the degree of integration of the semiconductor integrated circuit. However, it was not possible to avoid an increase in the scale and cost of a circuit with its digitization and a reduction in processing speed due to an increase in the quantity of data and complexity of its processing by any means.

An object of the present invention is to provide a technique capable of implementing a process for digitally demodulating a phase-modulated signal, in a simple and small-scale configuration suitable for semiconductor integration and a reduction in cost and in a configuration easy to provide speed-up and high accuracy without using a high-speed and high-resolution A/D converter.

Another object of the present invention is to provide a technique capable of realizing a process for digitally demodulating an amplitude phase-modulated signal by digital circuits having only the minimum analog circuits required and principal parts suitable for semiconductor integration, without using a rectangular detection circuit, an envelop detection circuit and a high-speed and high-resolution A/D converter.

The above and other objects and features of the present invention will become apparent from the description of the present specification and the accompanying drawings.

DISCLOSURE OF THE INVENTION

Summaries of typical ones of the inventions disclosed in the present application will be described briefly as follows:

A phase-modulated signal is demodulated in the following manner. Logical values of the phase-modulated signal waveform-shaped into a binary pulse signal are periodically sampled in response to a clock signal having a period which stands in integer ratio relationship to a carrier period of the phase-modulated signal, followed by serial shift-transmission to a shift register. Further, a parallel digital code train including information about the phase of the phase-modulated signal is taken out from each of shift stages in the shift register.

According to the above-described means, phase information required to demodulate digital data can be logically detected by analyzing logical patterns of the digital code trains taken out in parallel from the shift register. Thus, the objective of digitizing a process for digitally demodulating the phase-modulated signal, in a simple and small-scale configuration suitable for semiconductor integration and a reduction in cost and in a configuration easy to provide speed-up and high accuracy without using a high-speed and high-resolution A/D converter can be achieved.

In order to demodulate an amplitude phase-modulated signal, there are provided a phase detection unit for bringing the received amplitude phase-modulated signal into binary pulse form by a nonlinear amplifier with the central value of the modulated wave thereof as a threshold value and sampling it in response to a clock signal having a period which stands in integer ratio relationship to a carrier period of the modulated signal, and an amplitude detection unit for pulsating the received signal into binary form by a nonlinear amplifier with an intermediate value between different amplitude levels as a threshold value and detecting amplitude information according to the presence or absence of the pulse.

According to the above-described means, the received signal is pulsated by a plurality of nonlinear amplifiers different in threshold value from each other and thereafter results outputted from a phase detection unit and an amplitude detection unit each comprised of a digital circuit are synthesized, whereby digital data can be demodulated. Thus, the objective of implementing the analog circuit only by the nonlinear amplifier and realizing the principal part by the digital circuit suitable for semiconductor integration can be achieved.

BRIEF DESCRIPTION OF THE DRAWINGS

FIG. 1 is a block diagram showing an essential part of a first embodiment of a phase demodulator to which a technique of the present invention is applied;

FIG. 2 is a block diagram illustrating an essential part of a second embodiment showing a phase demodulator according to the present invention;

FIG. 11 is a diagram illustrating the replacement of bit patterns shown in FIG. 10 by other pattern symbols;

FIG. 16 is a diagram for describing states of sampling data obtained during a second interval;

FIG. 17 is a diagram for describing the sampling data obtained during the first and second intervals, which have been converted into decimal numbers;

FIG. 31 is a schematic diagram showing a satellite communication system illustrated as another application for a demodulator according to the present invention.

BEST MODE FOR CARRYING OUT THE INVENTION

Figure 3:
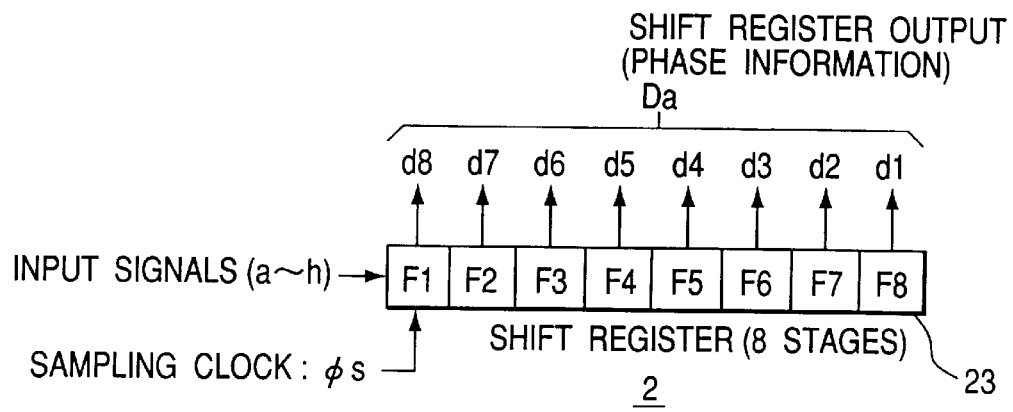
FIG. 3 is a block diagram depicting a specific example of a configuration of a phase information detection unit shown in FIG. 2.

Preferred embodiments of the present invention will hereinafter be described with reference to the accompanying drawings.

Incidentally, the same reference numerals in the drawings indicate the same or corresponding parts.

FIG. 1 shows a first embodiment of a phase demodulator to which a technique of the present invention is applied. Reference numeral 1 indicates a waveform shaping circuit, reference numeral 2 indicates a phase information detection unit, reference numeral 3 indicates a clock generator, reference numeral 4 indicates a code analyzer, and reference numeral 5 indicates a data determinator.

The waveform shaping circuit 1 shapes a phase-modulated signal (PSK signal) into a binary pulse signal uniform in duty width of H (high level) and L (low level).

The phase information detection unit 2 detects phase information Da from the PSK signal A by using a sampling portion 21 for periodically sampling logical values of the waveform-shaped PSK signal A to thereby generate a serial code train and a serial/parallel converter 22 for converting the serial code train into a parallel code train of a predetermined bit length every predetermined intervals (every predetermined number of samplings). The detected phase information Da is outputted in the form of the parallel code train.

The clock generator 3 outputs a clock signal φs having a period or cycle different from a carrier cycle or period (1/fc) of the PSK signal A and a period or cycle having an integer ratio relationship (e.g., 8:9) to the carrier period (1/fc). Further, the clock generator 3 allows the sampling portion 21 to sample the logical values of the PSK signal A in synchronism with the clock signal φs.

The code analyzer 4 logically detects phase difference information, based on a logical pattern shift or displacement on a time sequence of the phase information Da outputted from the phase information detection unit 2. The phase difference information is detected by reference to the previously-detected phase information and phase information detected at this time. Reference numeral 41 indicates a buffer memory for temporarily holding or retaining the previously-detected phase information therein.

The data determinator 5 generates demodulated data Dc, based on phase difference information Db logically detected by the code analyzer 4.

FIG. 2 illustrates an essential part of a second embodiment of the present invention.

In the second embodiment, the principal part of the phase information detection unit 2 shown in FIG. 1 is constructed of a shift register 23. The shift register 23 combines the function of the sampling portion 21 with the function of the serial/parallel converter 22. The shift register 23 samples the logical values of the waveform-shaped PSK signal A in synchronism with a sampling clock signal φs and serially shift-transmits the sampled logical values therefrom. Further, the shift register 23 inputs a parallel code train taken out from respective shift stages to a code analyzer 4 as phase information Da every number of samplings equivalent to the number of the shift stages of the shift register 23, i.e., each time samplings equal to the number of times corresponding to the number of the shift stages of the shift register 23 are completed.

FIG. 3 shows a specific configurational example of the phase information detection unit 2 shown in FIG. 2.

As shown in the same drawing, the principal part of the phase information detection unit 2 is made up only of a shift register 23. The shift register 23 shown in the same drawing has eight serial shift stages (F1 through F8). The shift register 23 samples logical values of an input signal by one bit in synchronism with a sampling signal φs and serially shift-transmits the sampled logical values therefrom. The respective shift stages (F1 through F8) of the shift register 23 can take out phase information Da (d1 through d8) converted into a parallel code train each time eight samplings are completed.

Figure 4:
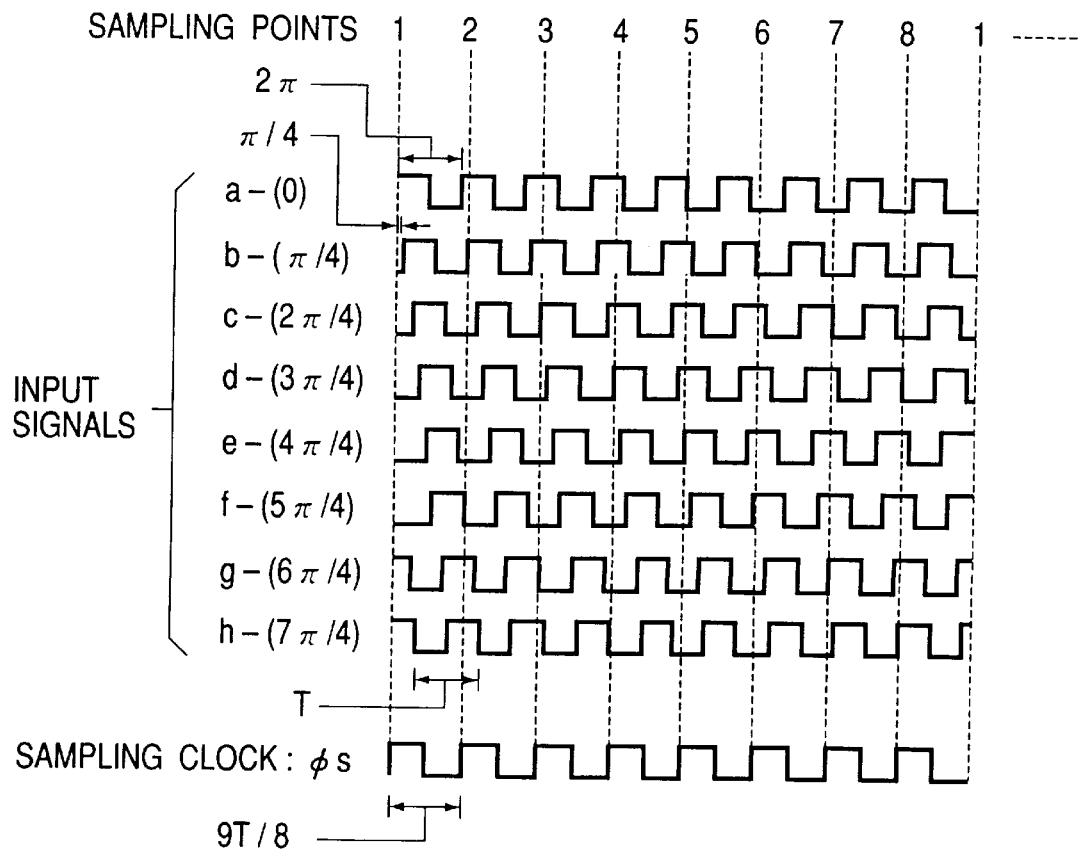
FIG. 4 is a timing chart for describing the relationship between the phase of an input signal shown in FIG. 3 and sampling positions.

FIG. 4 is a waveform chart for describing the relationship between each phase of the input signal and its sampling positions in the configuration shown in FIG. 3.

In the same drawing, symbols a through h respectively indicate phase modes of the input signal. The input signal indicative of a PSK signal takes any of the phase modes a through h according to modulated information.

The sampling clock signal φs has a period or cycle different from a carrier cycle or period T of the input signal (a through h) and is set to a cycle or period (9T/8) so as to take an integer ratio of 8:9 with respect to the carrier period T. Sampling is done on the leading edge (with timing indicated by each broken line in the drawing) of the sampling clock signal φs.

The relationship in position between the input signal and the sampling points is as follows. The carrier period T of the input signal and the period (9T/8) of the sampling clock signal φs are different from each other and they have a 8:9 integer ratio connection with each other. Therefore, an angular position shift or displacement of 2π/8 is produced for each period of the input signal. This position shift is stored for each sampling. However, this storage cycle is put back into position so as to reach one period (16π/8=2π) in eight cycles of the input signal. That is, the sampling clock signal φs functions as a vernier scale in a time sequence. Thus, one period of the input signal can be decomposed into 2π/8 for sampling with the sampling clock signal φs having a period (9T/8) not so different from the carrier period T of the input signal, i.e., even without the use of a clock signal having a considerable high frequency.

In this case, the carrier signal involves a phase shift or change because of being PSK-modulated. However, since the carrier frequency is enough higher than a modulated frequency, the period of the phase change due to the PSK modulation becomes sufficiently longer than the period T of the carrier signal. Accordingly, the influence of the phase change produced due to the PSK modulation can be substantially neglected during the interval of at least about eight cycles (8T) of the carrier signal.

Figures 5, 6:
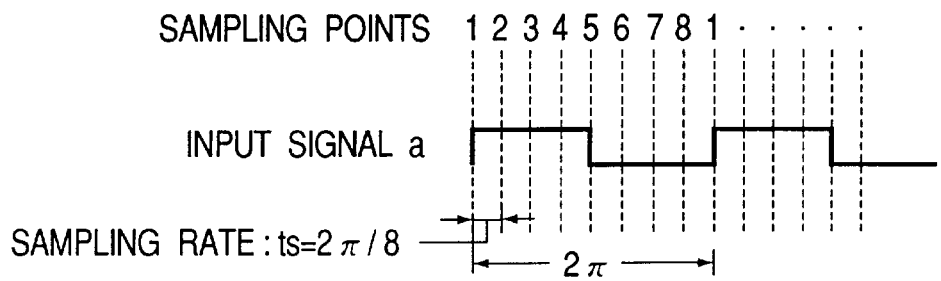
FIG. 5 is a timing chart for describing positions of sampling points with respect to an input signal.
FIG. 6 is a diagram showing an example of shift register outputs with respect to each input signal.

FIG. 5 shows the positions of sampling points with respect to an input signal.

In the phase demodulator shown in FIG. 3, the input signal is sampled at eight sampling points every eight cycles (8T) thereof as shown in the same drawing.

FIG. 6 is a truth table showing examples of parallel outputs of a shift register with respect to phase modes of an input signal.

As shown in the same drawing, the parallel outputs of the shift register constituting the phase information detection unit exhibit specific bit patterns (combination patterns of "1" and "0") every phase modes (a through h) of the input signal. Thus, the analysis of the state of shift or displacement of each bit pattern allows logical detection of to which degree the phase of the input signal has been changed. Demodulated data can be generated based on the so-detected phase difference information.

As described above, the logical values of the phase-modulated signal waveform-shaped into the binary pulse signal are periodically sampled in response to the clock signal having the period placed in the integer ratio relation to the carrier period of the modulated signal and serially shift-transmitted to the shift register. Further, the parallel digital code train including information about the phases of the phase-modulated signal is taken out from the respective shift stages of the shift register and its logical patterns are analyzed, whereby the phase difference information required to demodulate digital data can be obtained. Thus, the process for digitally demodulating the phase-modulated signal can be digitized by a simple and small-scale configuration suitable for bringing the present embodiment into a semiconductor integrated circuit and less cost and by a configuration easy to provide speed-up and high accuracy without the use of a high-speed and high-resolution A/D converter. It is accordingly possible to demodulate even the phase-modulated signal high in carrier frequency with ease and satisfactory efficiency.

Figure 7:
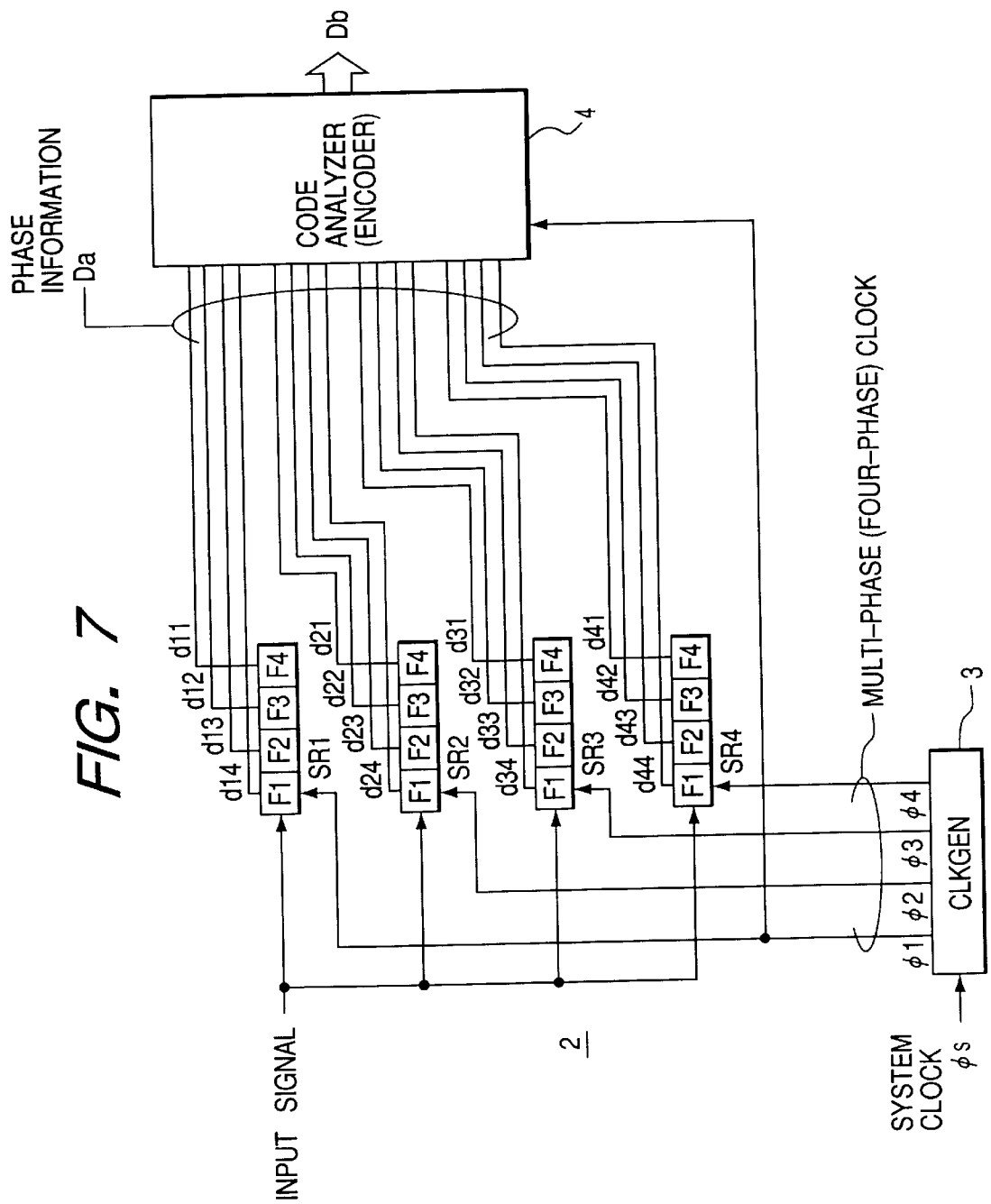
FIG. 7 is a block diagram illustrating an essential part of a third embodiment showing a phase demodulator according to the present invention.

FIG. 7 shows an essential part of a third embodiment according to the present invention.

In a phase demodulator shown in the same drawing, the principal part of a phase information detection unit 2 comprises a plurality (four) of four-stage shift registers SR1 through SR4. Along with this, a clock generator 3 makes use of a multi-phase clock generator for distributing multi-phase clock signals φ1 through φ4 different in phase from each other by π/4 to the shift registers SR1 through SR4 in cycles identical to each other.

A common input signal (PSK signal) is divided into and inputted to the respective shift registers SR1 through SR4. A parallel code train (d11 to d14, d21 to d24, d31 to d34 and d41 to d44) amounting to 16 bits set by 4 bits in all is taken out from the shift registers SR1 through SR4.

The sampling clock signals φ1 through φ4 are four-phase clock signals different in phase from each other by π/4 with cycles (5T/4) identical to each other. The first-phase clock φ1, the second phase clock φ2, the third phase clock φ3 and the fourth phase clock φ4 are respectively supplied to the first shift register SR1, the second shift register SR2, the third shift register SR3 and the fourth shift register SR4 as sampling and shift clocks.

Figure 8:
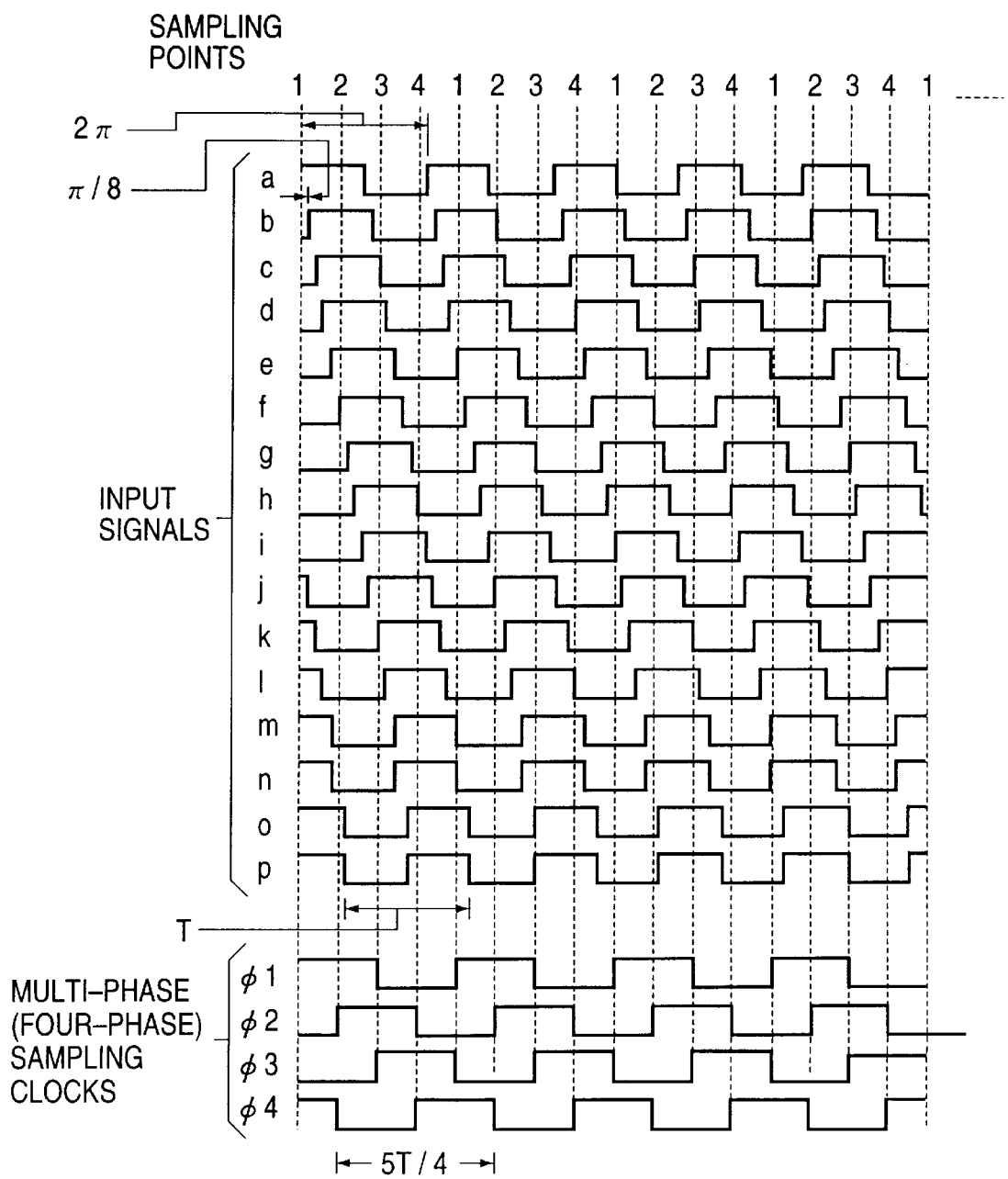
FIG. 8 is a timing chart for describing the relationship between the phase of an input signal shown in FIG. 7 and sampling positions.

FIG. 8 is a waveform chart for describing the relationship between the respective phases of the input signal and their sampling positions in the configuration shown in FIG. 7.

In the same drawing, symbols a through p indicate phase modes of the input signal respectively. The input signal indicative of a PSK signal assumes any of the phase modes a through p according to modulated information.

The input signal divided into the four shift registers SR1 through SR4 is sampled by the respective shift registers SR1 through SR4 on the leading edges of the clock signals φ1 through φ4 and serially shift-transmitted from the respective shift registers SR1 through SR4.

Figures 9, 10:
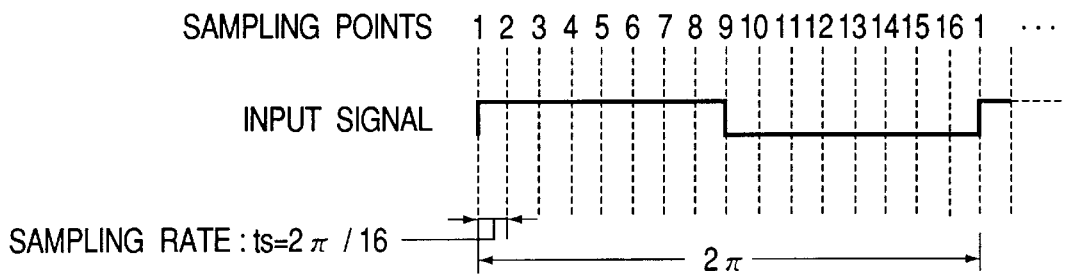
FIG. 9 is a timing chart for describing positions of sampling points with respect to an input signal.
FIG. 10 is a diagram showing an example of shift register outputs with respect to each input signal.

FIG. 9 shows the positions of sampling points with respect to an input signal.

As shown in the same drawing, the input signal is sampled 16 times in total by four times every five cycles (5T) with four clock signals φ1 through φ4.

FIG. 10 is a truth table showing examples of parallel outputs of shift registers with respect to phase modes of an input signal.

As shown in the same drawing, the parallel output data (d11 to d14, d21 to d24, d31 to d34 and d41 to d44) of the four shift registers SR1 through SR4 constituting the phase information detection unit exhibit specific bit patterns (combination patterns of "1" and "0") every phase modes (a through p) of the input signal.

FIG. 11 shows the replacement of the bit patterns (1100, 0110, 0011 and 1001) shown in FIG. 10 with four pattern codes or symbols (A=1100, B=0110, C=0011 and D=1001) of A, B, C and D. Thus, the analysis of the state of shift or displacement of each of the bit patterns developed according to the phase modes (a through p) of the input signal allows logical detection indicative of to which degree the phase of the input signal has been changed.

In the embodiment illustrated in FIGS. 7 through 11 as described above, the phase information at 16 sampling points can be detected every five cycles (5T) of the input signal.

Figure 12:
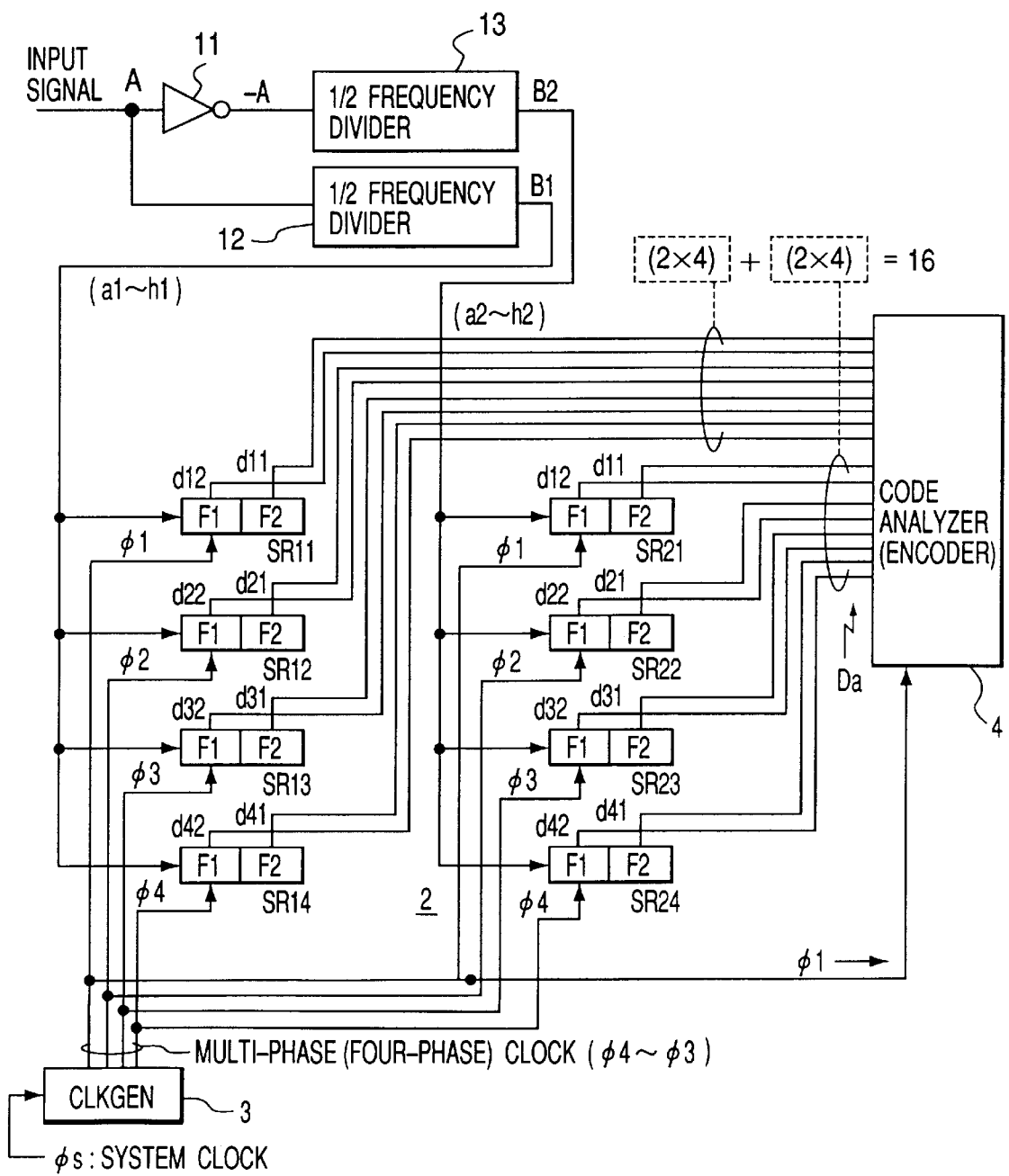
FIG. 12 is a block diagram depicting an essential part of a fourth embodiment showing a phase demodulator according to the present invention.

FIG. 12 shows an essential part of a fourth embodiment according to the present invention.

In the fourth embodiment, there are first provided an inverter 11 for phase-inverting an input signal (PSK signal) A, a first frequency divider 12 for dividing-by-½ a non-inverse input signal A prior to being phase-inverted, and a second frequency divider 13 for dividing-by-½ an inverse input signal −A subjected to phase inversion.

Further, a first shift register series (SR11 through SR14) for sampling logical values of an input signal B1 divided-by-½ by the first frequency divider 12 and performing serial/parallel converting processing on them and a second shift register series (SR21 through SR24) for sampling logical values of an input signal B2 divided-by-½ by the second frequency divider 13 and performing serial/parallel converting processing on them are provided.

The first and second shift register series (SR11 through SR14) and (SR21 through SR24) respectively have shift registers of two stages (F1 and F2) by four. The respective series of shift registers (SR11 through SR14 and SR21 through SR24) perform sampling and serial shift operations according to four-phase clocks φ1 through φ4 supplied from a clock generator 3, respectively.

Figure 13:
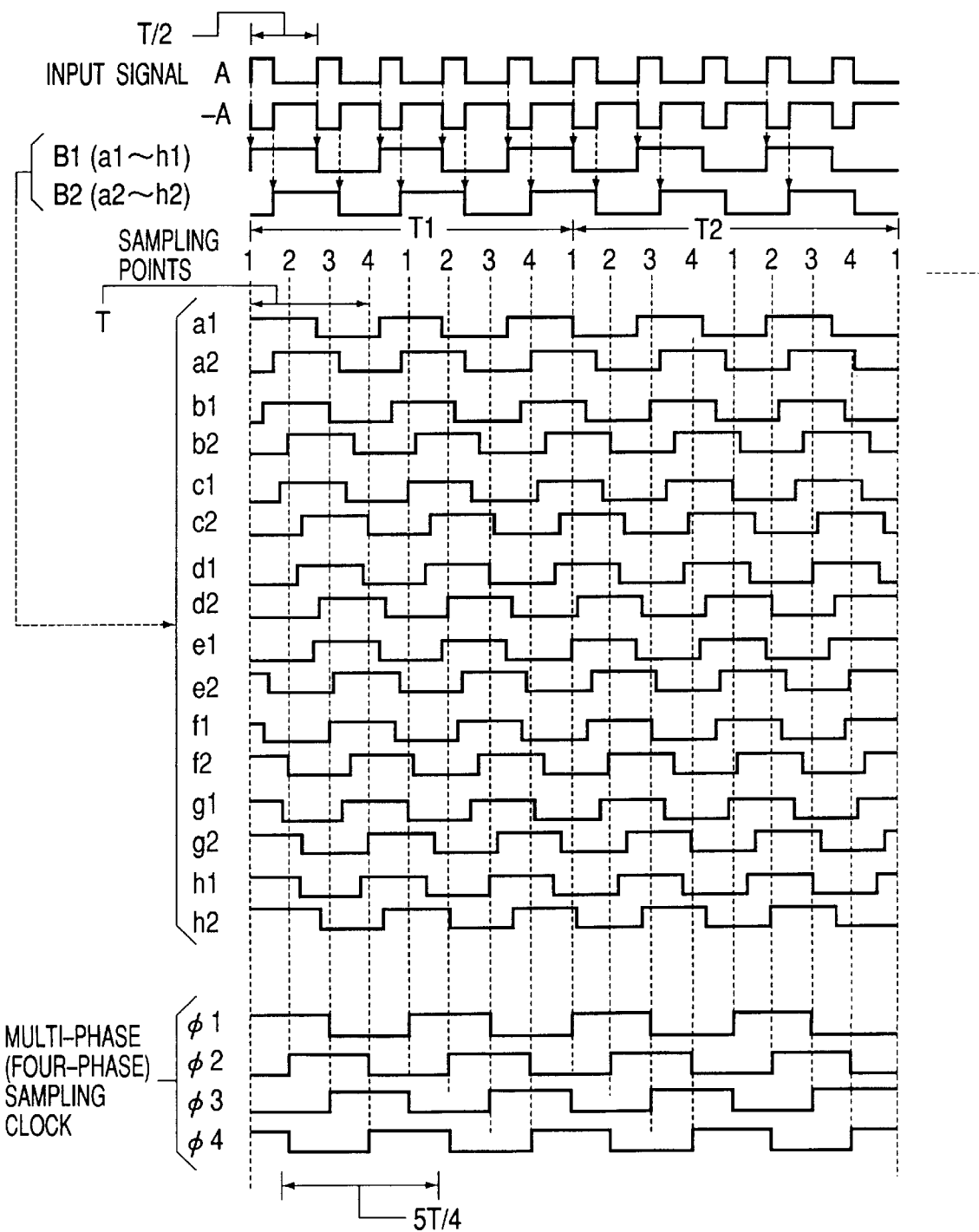
FIG. 13 is a timing chart for describing the relationship between the phases of input signals shown in FIG. 12 and sampling positions.

FIG. 13 is a waveform chart for describing the relationship between the phases of input signals (a1 through h1) and (a2 through h2) and their sampling positions in the configuration shown in FIG. 12.

In the same drawing, B1 (a1 through h1) indicates a divided-by-½ signal of the non-inverse input signal A and B2 (a2 through h2) indicates a divided-by-½ signal of the inverse input signal −A. As shown in the same drawing, the signals B1 and B2 obtained by respectively dividing-by-½ the input signals A and −A are rendered uniform in duty width of H (high level) and L (low level).

The divided-by-½ signal B1 (a1 through h1) of the non-inverse input signal A and the divided-by-½ signal B2 (a2 through h2) of the inverse input signal −A are respectively subjected to sampling and serial-shift transmitting processing by the first shift register series (SR11 through SR14) and the second shift register series (SR21 through SR24) based on the four-phase clocks φ1 through φ4.

In this case, the numbers of shift stages of the respective shift registers SR11 through SR14 and SR21 through SR24 are respectively provided by two stages (F1 and F2). Parallel data sizes capable of being taken out from the respective shift registers respectively are 2 bits. Therefore, bit patterns capable of being taken out in parallel from the respective shift registers SR11 through SR14 and SR21 through SR24 result only in sampling data with respect to half periods of the divided-by-½ signals B1 and B2. This is because the half periods (T/2) of the divided-by-½ signals B1 and B2 are equivalent to one periods (T/2) of the input signals A and −A prior to being divided-by-½. That is, sampling data corresponding to the half periods (T/2) of the divided-by-½ signals B1 and B2 are equivalent to sampling data corresponding to one periods (T/2) of the input signals A and −A prior to being divided-by-½.

When the numbers of the shift stages of the respective shift registers SR11 through SR14 and SR21 through SR24 are respectively provided by two stages and the ratio between the period T of each of the divided-by-½ signals B1 and B2 and the period (5T/4) of each of the clock signals φ1 through φ4 indicates an integer ratio of 4:5, phase information at eight sampling points is detected every five cycles (5T) of the divided-by-½ signals B1 and B2.

In this case, the sampling data with respect to the first-half or former half cycles or periods of the divided-by-½ signals B1 and B2 are obtained during the 2.5 cycles or periods (2.5T) corresponding to the first half of the five cycles (5T). Further, the sampling data with respect to the latter half periods of the divided-by-½ signals B1 and B2 are obtained during the 2.5 cycles (2.5T) corresponding to the latter half of the five cycles (5T).

That is, the respective periods of the divided-by-½ signals B1 and B2 are respectively divided into two of first and second intervals T1 and T2 and subjected to sampling. The sampling data in the former half cycles of the divided-by-½ signals B1 and B2 are obtained during the first interval T1. The sampling data in the latter half cycles of the divided-by-½ signals B1 and B2 are obtained during the second interval T2.

Figures 14, 15:
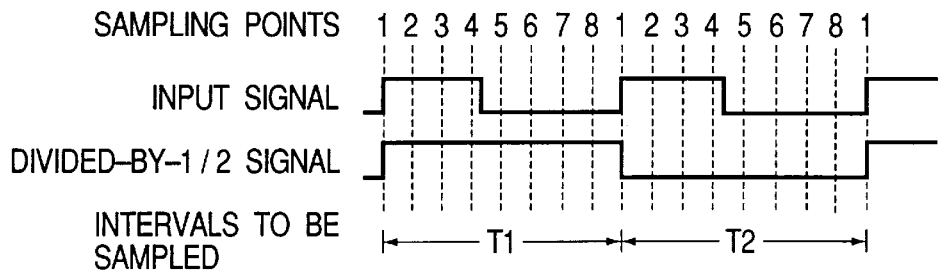
FIG. 14 is a timing chart for describing positions of sampling points with respect to input signals.
FIG. 15 is a diagram for describing states of sampling data obtained during a first interval.

FIG. 15 shows logical states of sampling data obtained from the respective shift registers SR11 through SR14 and SR21 through SR24 during the first interval T1.

FIG. 16 illustrates logical states of sampling data obtained from the respective shift registers SR11 through SR14 and SR21 through SR24 during the second interval T2.

FIG. 17 depicts the sampling data obtained during the first and second intervals T1 and T2, which have been converted into decimal numbers (3=11, 2=10, 1=01 and 0=00) every shift registers.

As shown in FIG. 17, phase states in the former half cycles of the divided-by-½ signals B1 and B2 can be specified according to a logical pattern of the sampling data acquired during the first interval T1. Similarly, phase states in the latter half cycles of the divided-by-½ signals B1 and B2 can be specified according to a logical pattern of the sampling data acquired during the second interval T2.

As shown in FIG. 17, the logical pattern of the sampling data obtained during the first interval T1 and the logical pattern of the sampling data obtained during the second interval T2 stand in complementary relationship to each other. This is because as described above, phase information in the half cycles (T/2) of the divided-by-½ signals B1 (a1 through h1) and B2 (a2 through h2) include phase information in one cycles of the input signals A and −A prior to being divided-by-½. Accordingly, the logical patterns of the sampling data obtained during the first and second intervals T1 and T2 respectively stand in the complementary relationship to each other but are substantially equivalent to each other. Thus, an error check or the like can be made to the sampling data by checking its complementary relationship.

Figure 18:
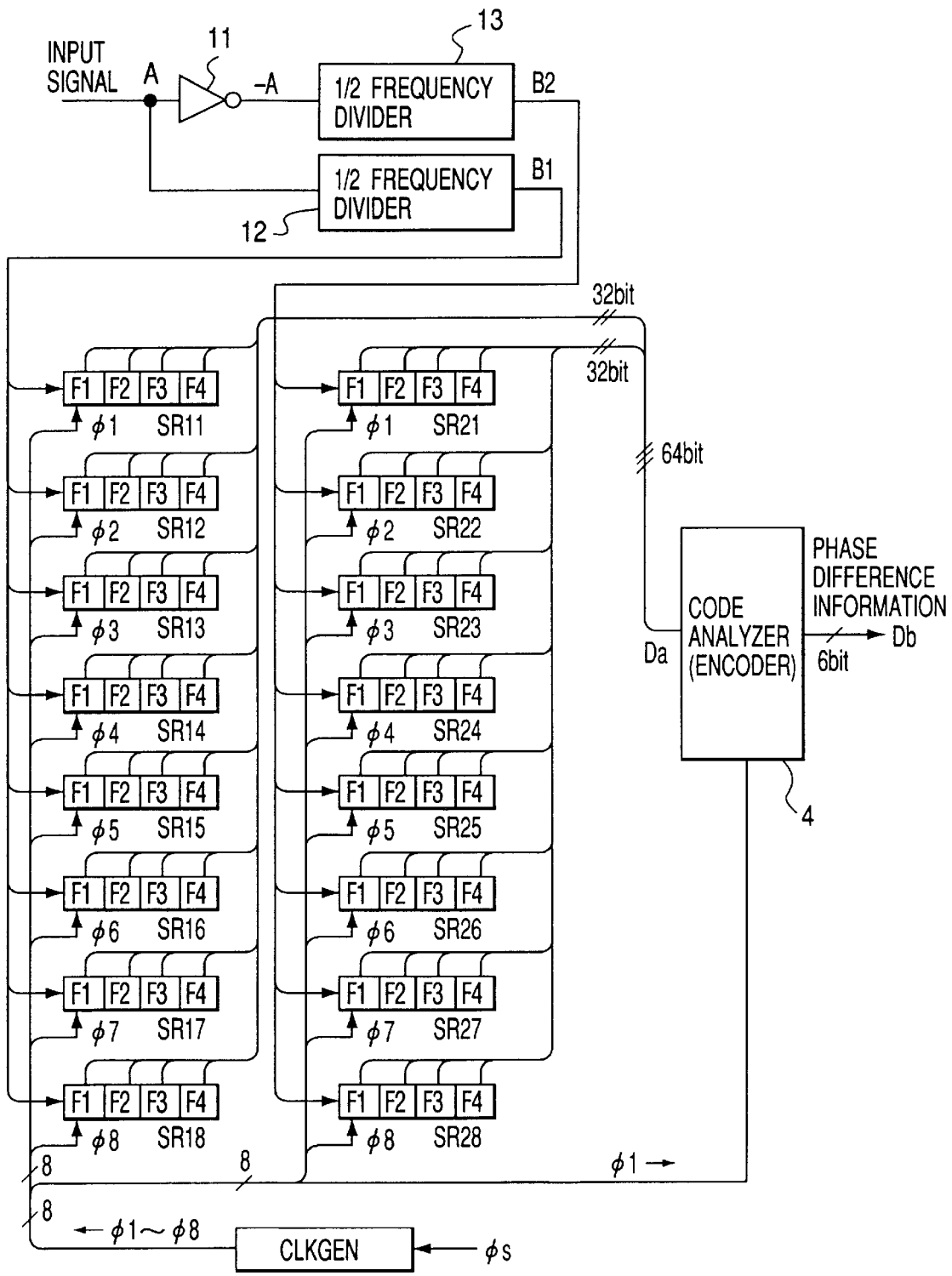
FIG. 18 is a block diagram illustrating an essential part of a fifth embodiment showing a phase demodulator according to the present invention.

FIG. 18 shows an essential part of a fifth embodiment according to the present invention.

The embodiment shown in the same drawing is equivalent to one formed by expanding the configuration shown in FIGS. 12 through 17. Four-stage eight shift register series are provided in two rows. Further, samplings at the respective shift register series (SR11 through SR18) and (SR21 through SR28) are performed using multi-phase clock signals $\phi 1$ through $\phi 8$ of eight phases. Thus, the number of sampling points is expanded to 32 points and correspondingly the accuracy of resolution for the detection of phase information is also enhanced.

Figure 19:
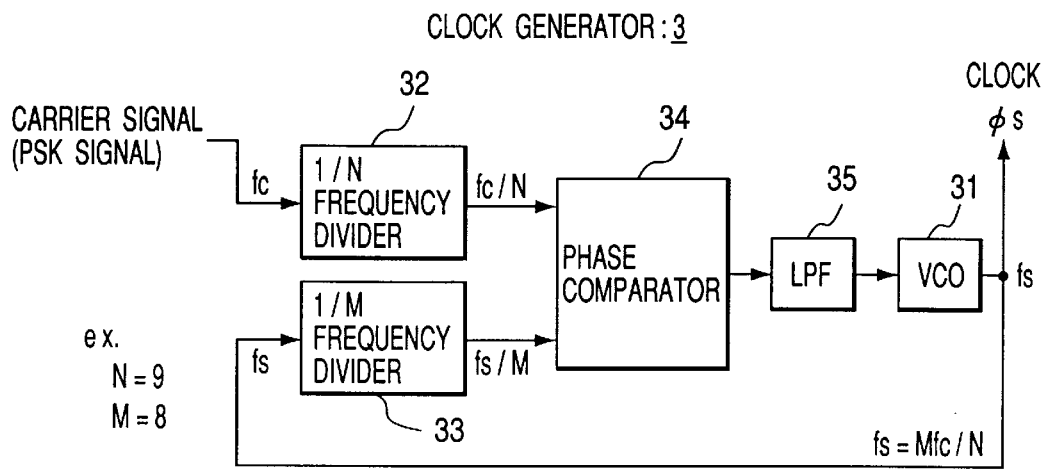
FIG. 19 is a block diagram showing a first embodiment of a clock generator.

FIG. 19 shows a first embodiment of a clock generator.

The clock generator 3 shown in the same drawing is a single-phase clock generator and is made up of a PLL (Phase Control or Locked Loop) which consists of a voltage-controlled oscillator (VCO) 31, a 1/N (where N: integer greater than or equal to 2) frequency divider 32, a 1/M (where M: integer different from N and greater than or equal to 2) frequency divider 33, a phase comparator 34, and a low-pass filter 35.

In this case, the 1/N frequency divider 32 by-1/N divides a carrier frequency fc of a PSK signal. Similarly, the 1/M frequency divider 33 by-1/M divides an oscillation frequency fs of the VCO 31. The phase comparator 34 and the low-pass filter 35 feedback control the oscillation frequency fs of the VCO 31 so that the phase of a divided-by-1/N signal (fc/N) and the phase of a divided-by-1/M signal (fs/M) coincide with each other. Thus, a clock signal $\phi s$ that stands in frequency relationship of fs=Mfc/N, can be taken out from the oscillation output (fs) of the VCO 31.

Figure 20:
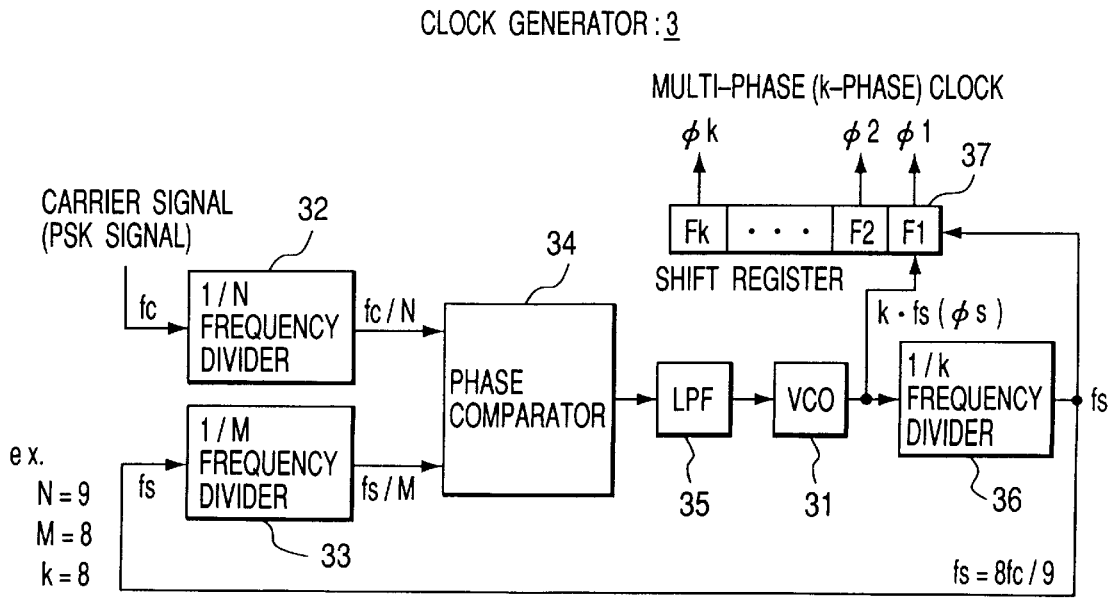
FIG. 20 is a block diagram illustrating a second embodiment of the clock generator.

FIG. 20 shows a second embodiment of the clock generator 3.

The clock generator 3 shown in the same drawing is a multi-phase clock generator, which is provided with a 1/k frequency divider 36 and a k-stage shift register 37 in addition to the configuration shown in FIG. 19.

In the clock generator 3, an oscillation frequency k·fs (where k: integer greater than or equal to 2) of a VCO 31 is defined as a fundamental or basic clock $\phi s$ and the basic clock signal is by-1/k divided into a divided-by-1/k clock signal (fs). The k-stage shift register 37 serially shift-transmits the clock signal (fs) in synchronism with the basic clock signal $\phi s$ (=k·fs). Thus, multi-phase clock signals $\phi 1$ through $\phi k$ different in phase from each other can be taken out in parallel from respective shift stages (F1 through Fk) of the k-stage shift register 37.

Figure 21:
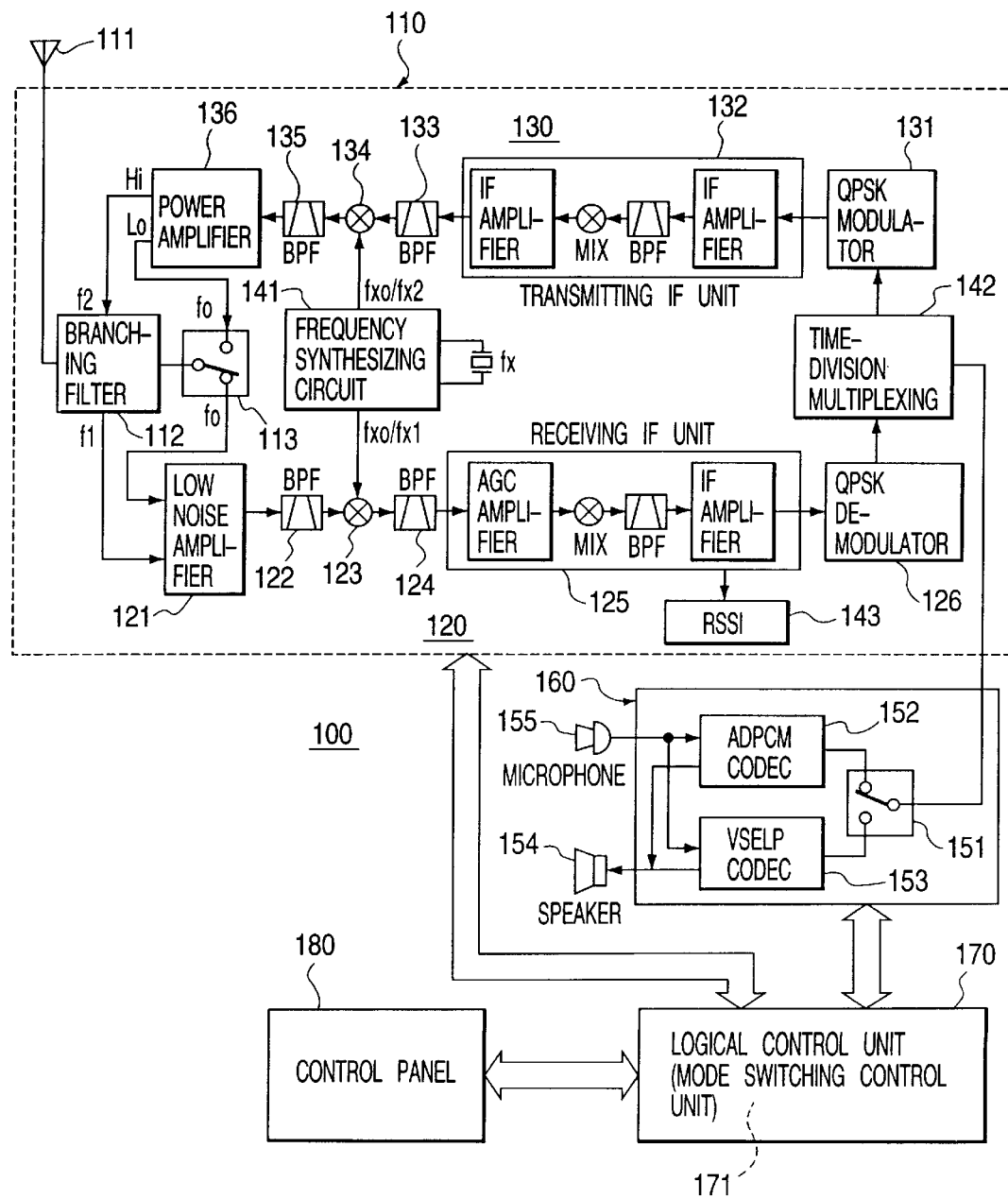
FIG. 21 is a block diagram depicting an example of a configuration of a mobile communication device illustrated as an application for a phase demodulator according to the present invention.

FIG. 21 shows an application of the phase demodulator according to the present invention.

The application shown in the same drawing is a mobile communication device equipped with both terminal functions of a personal handyphone system (PHS) and a personal digital cellular system (PDC). Reference numeral 110 indicates a radio transmitter/receiver unit, reference numeral 111 indicates a radio antenna, reference numeral 160 indicates a codec unit for performing coding and decoding processing on a call or traffic signal, reference numeral 170 indicates a logical control unit constructed of a microprocessor, and reference numeral 180 indicates a control panel.

The radio transmitter/receiver unit 110 comprises a branching filter 112, a transmit/receive selector switch 113, a radio receiver unit 120, a phase demodulator 126 according to the present invention referred to above, a radio transmitter unit 130, a phase modulator 131, a frequency synthesizing circuit 141 using a PLL, a time-division multiplexing circuit 142, a received field strength detection circuit (RSSI) 143, etc.

The radio receiver unit 120 comprises a low noise amplifier 121 ready for two frequency bands of and f1 of PHS and PDC, a RF bandpass filter 122 for extracting a receive or received signal of the intended frequency band of or f1, a mixer 123 for performing frequency conversion (down converter), an IF bandpass filter 124 for extracting an intermediate frequency signal generated by the down converter, an IF unit 125 including an intermediate frequency amplifier, a second frequency converter and an AGC portion, etc.

The radio transmitter unit 130 comprises an IF unit 132, an IF bandpass filter 133, a mixer 134 for performing frequency conversion (up converter), a RF bandpass filter 135, a high frequency output amplifier 136 ready for two frequency bands of and f2 of PHS and PDC and two kinds of transmit outputs (low output/high output), etc.

The frequency synthesizing circuit 141 PLL-synthesizes a local signal fxo/fx1 for performing frequency conversion at the receiver unit 120 and a local signal fxo/fx2 for performing frequency conversion at the transmitter unit 130, based on a temperature-compensated high-accuracy reference frequency signal fx.

Now, the radio receiver unit 120 and the radio transmitter unit 130 are constructed so that the setting for the switching between a receiving frequency band and transmitting frequency band and the switching between high and low transmit output levels can be done to support or respond to two kinds of modes of PHS and PDC. The branching filter 112 is used for achieving separation between a signal received by the antenna 111 and a signal transmitted to the antenna 111 when transmission and reception are simultaneously done with different frequencies upon the PDC mode. The transmit/receive selector switch 113 is used for switching the antenna 111 to the radio receiver unit 120 side or the transmitter unit 130 side at high speed when transmission and reception are time-divisionally done with the same frequency upon the PHS mode.

The codec unit 160 includes an ADPCM (Adaptive Differential Pulse Code Modulation) codec 152 for performing coding and decoding processing on a call or speech signal in the PHS mode, a VSELP (Vector Sum Excited Linear Prediction) codec 153 for performing coding and decoding processing on the speech signal in the PDC mode, a codec selector switch 151 for performing switching between the two codecs 152 and 153 according to the PHS/PDC modes, etc. Reference numeral 154 indicates a speaker for acoustically producing a received speech signal and reference numeral 155 indicates a microphone for converting a sending speech sound into a sending speech signal.

A mode switching control unit 171 for controlling the setting for switching between the PHS and PDC modes, based on the output of the received field strength detection circuit 143 is incorporated into the logical control unit 170 on a software basis. The mode switching control unit 171 by-switching sets the transmitting and receiving frequency bands and the transmit output level of the radio transmitter/receiver unit 110, the selection of the codecs 152 and 153, the multiplex mode or system for the transmit and receive signals, etc. to thereby make it possible to set the switching between the PHS terminal function and the PDC terminal function while a large number of portions in a circuit are being held in common.

In the mobile communication device referred to above, the phase demodulator 126 according to the present invention is suitable for a semiconductor integrated circuit and can be reduced in its circuit scale. Therefore, the phase demodulator 126 can greatly contribute to a size reduction in equipment and a reduction in cost. Since it is easy to speed up the phase demodulator 126 and bring it into high accuracy, the phase demodulator can be used even if the carrier frequency is high. Thus, the frequency of the intermediate frequency signal can be rendered high, so that a reception system can be simplified in configuration.

Figure 22:
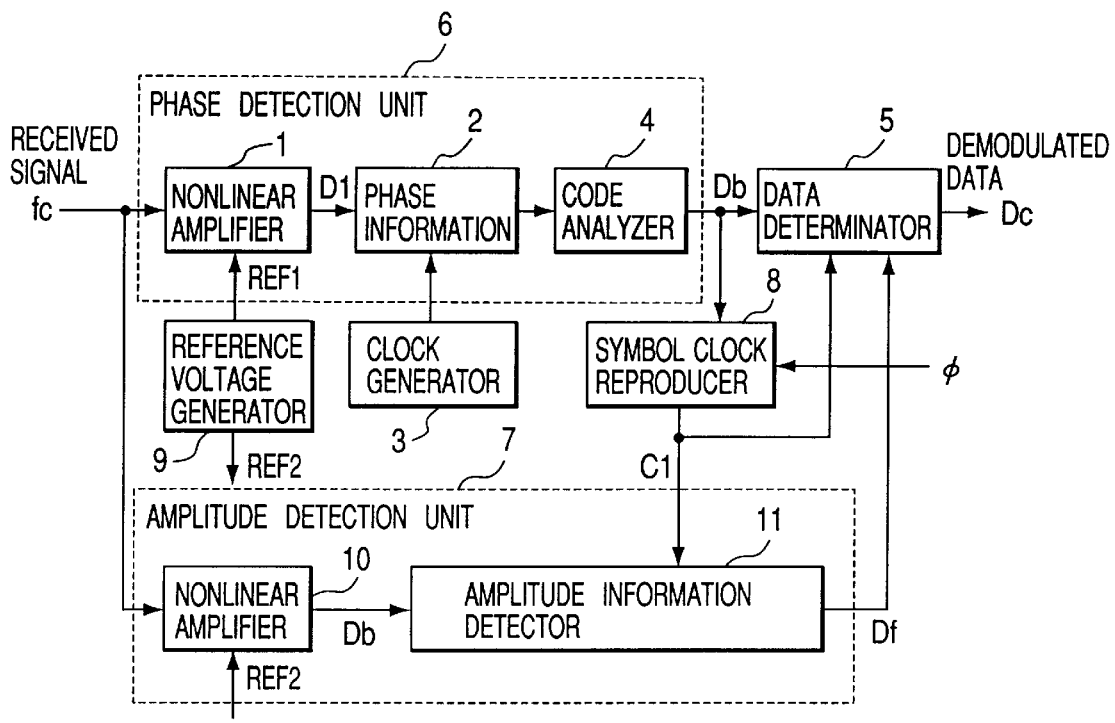
FIG. 22 is a block diagram showing an essential part of a first embodiment of an amplitude phase demodulator to which the technique of the present invention is applied.

FIG. 22 shows a first embodiment of an amplitude phase demodulator to which a technique of the present invention is applied. As shown in FIG. 22, the amplitude phase demodulator according to the present embodiment has a phase detection unit 6 for detecting the phase of a received signal fc, and an amplitude detection unit 7 for detecting the amplitude of the received signal fc. The phase detection unit 6 is configured in a manner similar to the phase detection unit of the phase demodulator shown in FIGS. 1 and 2. Each of the waveform shaping circuits 1 shown in FIGS. 1 and 2 for shaping the received signal fc into the binary pulse signal is made up of a nonlinear amplifier using an operational amplifier in accordance with the configuration of the amplitude detection unit 7. However, a circuit may be used wherein an inverter circuit is used in place of the nonlinear amplifier and the output of the inverter circuit is fed back to an input terminal through a resistor. When the nonlinear amplifier is used, a reference voltage generator 9 for selecting the central potential of the received signal fc as a threshold level thereof and generating such a voltage is provided. The reference voltage generator 9 supplies the voltage generated therefrom to the waveform shaping circuit 1 as a reference voltage REF1. The reference voltage generator 9 also generates a reference voltage REF2 for a nonlinear amplifier 10 of the amplitude detection unit 7.

The amplitude detection unit 7 comprises the nonlinear amplifier 10 for shaping the received signal fc into a binary pulse signal according to its amplitude, and an amplitude information detector 11 for detecting amplitude information from the signal converted into binary form. The reference voltage REF2 is supplied from the reference voltage generator 9 to the nonlinear amplifier 10 as a threshold level for shaping the received signal fc into the binary pulse signal according to its amplitude. Incidentally, the received signal fc produces so-called fading that the level of its amplitude varies according to the distance between the transmitting side and the receiving side, for example, and changes according to communication conditions. Thus, an AGC (Auto Gain Control) circuit may be provided before the nonlinear amplifier 10 in order to avoid the influence of a change in received average power by variations in amplitude every received signals, fading and the like. Further, the amplitude phase demodulator according to the present embodiment is provided with a symbol clock reproducer 8 for reproducing a symbol clock C1 having a period equivalent to one symbol period, based on phase difference information obtained by the processing of the phase detection unit 6.

The operation of the amplitude phase demodulator according to the present embodiment will next be explained.

Figure 23A:
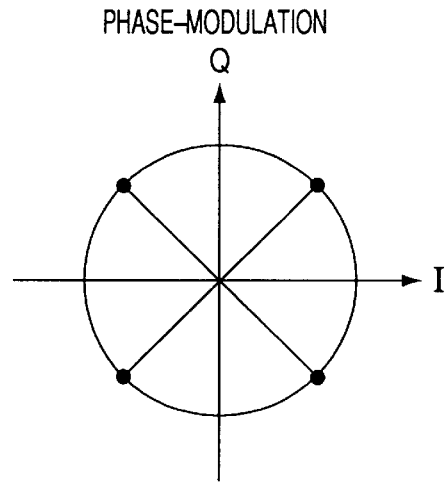
FIGS. 23(a) and 23(b) are phase diagrams for describing the placement of an amplitude phase-modulated signal.
Figure 23B:
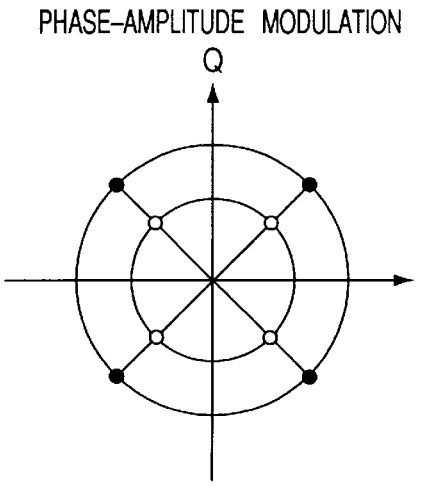
Figure 24:
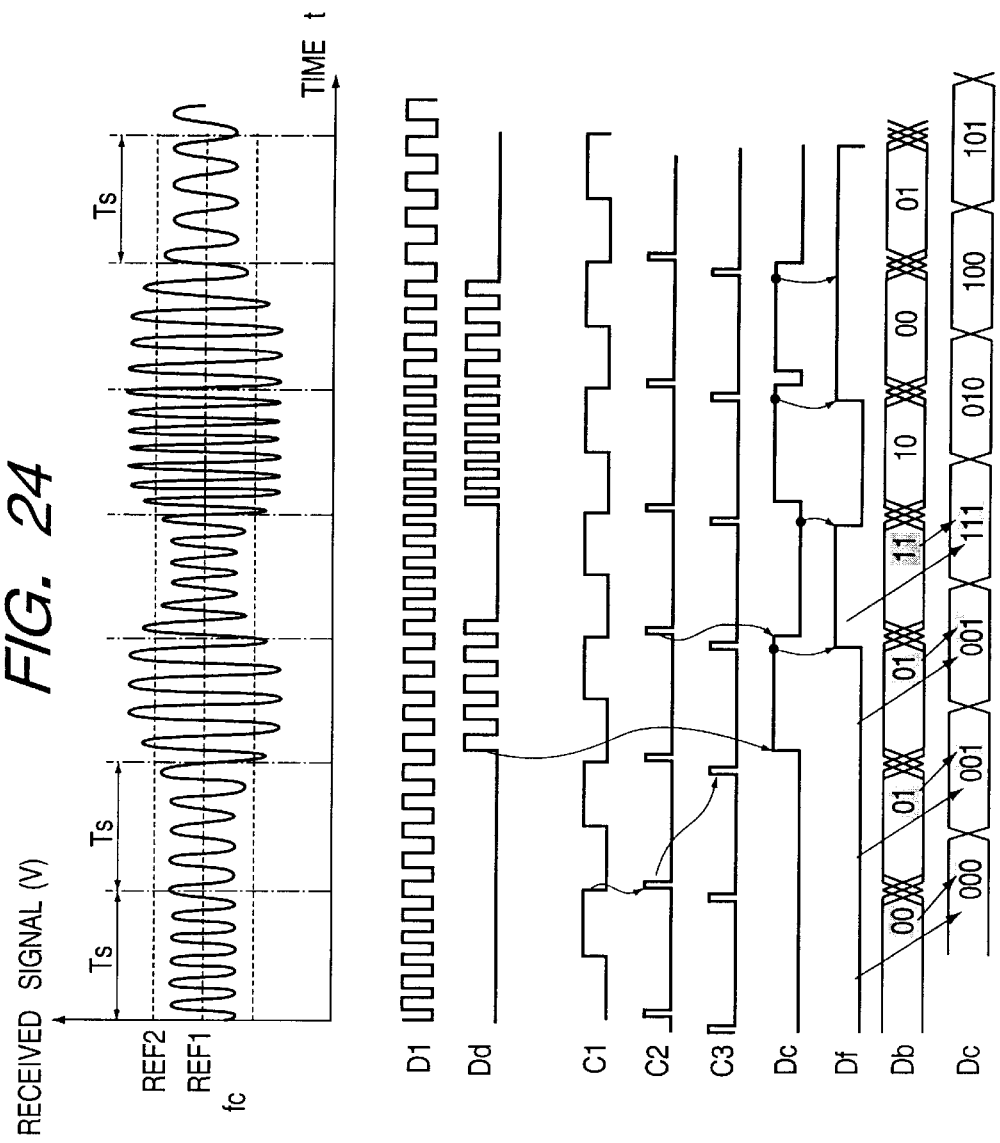
FIG. 24 is a waveform chart showing examples of waveforms of a receive signal and signals produced inside the amplitude phase demodulator shown in FIG. 22.

FIG. 23 shows the layout of an amplitude phase-modulated signal. Although not restricted in particular, a phase component of the received amplitude phase-modulated signal is subjected to differential coding in advance and a carrier is defined as being modulated. In the phase modulation, 2-bit information per symbol is transmitted, whereas 3-bit information per symbol can be transmitted in the amplitude phase modulation. FIG. 24 shows examples of waveforms of a received signal fc and signals produced inside the amplitude phase demodulator. As the reference voltage REF2 for supplying the threshold value at the nonlinear amplifier 10, an intermediate level between a peak level at a stationary or steady portion of a small amplitude part of the received signal fc and a peak level at a steady portion of a large amplitude part thereof is selected as shown in FIG. 24.

In the present embodiment, the received signal fc is supplied to each of the phase detection unit 6 and the amplitude detection unit 7. In the phase detection unit 6, the nonlinear amplifier 1 amplifies the central voltage (REF1) of the received signal fc as a threshold value and converts it into a pulse signal D1 whose amplitude is constant. As a result, the pulse signal D1 results in a signal having only phase information. The phase information detector 2 detects the phase information from the pulse signal D1 and supplies it to a code analyzer 4. The code analyzer 4 detects phase difference information Db from the phase information detected before one symbol and phase information detected at this time and supplies it to a data determinator 5.

The symbol clock reproducer 8 is inputted with a reference clock φ from the outside and reproduces the symbol clock C1, based on the reference clock. At this time, however, the symbol clock reproducer 8 matches the symbol clock C1 with a point for maximizing an eye's aperture of an eye pattern of the received signal fc, based on the phase difference information Db supplied from the code analyzer 4 to thereby reproduce the symbol clock C1 synchronized with the received signal.

On the other hand, in the amplitude detection unit 7, the linear amplifier 10 using the reference voltage REF2 as the threshold value amplifies the received signal fc and converts it into a pulse signal Dd whose amplitude is constant. When the amplitude of the received signal is smaller than the threshold value REF2, the pulse signal Dd is brought to a Low level. When the amplitude of the received signal is greater than the threshold value REF2, the pulse signal Dd is brought to an High and Low repetitive pulse. The amplitude information detector 11 detects amplitude information Df from the pulse signal Dd and sends it to the data determinator 5. The data determinator 5 determines or makes a decision as to received or receive data from the phase information Db detected by the phase detection unit 6 and the amplitude information Df detected by the amplitude detection unit 7 and generates and outputs demodulated data Dc therefrom.

Figure 25:
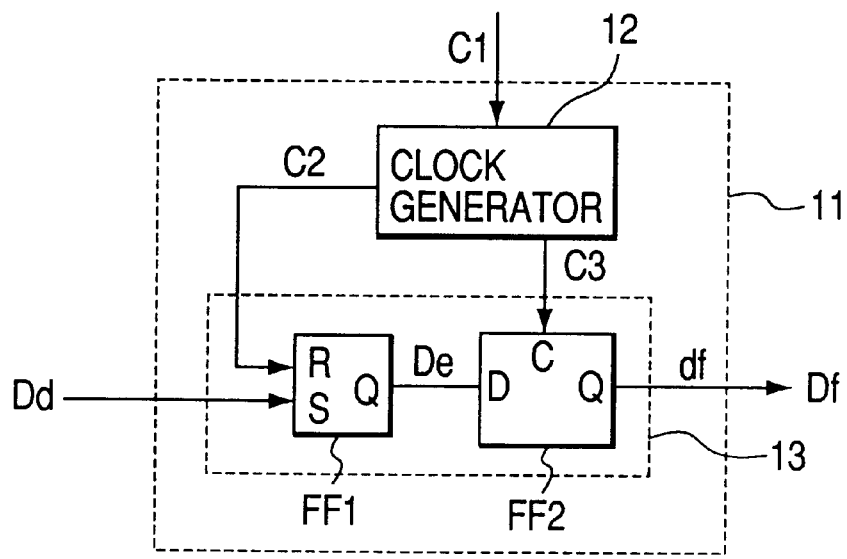
FIG. 25 is a block diagram illustrating an embodiment of an amplitude information detector.

FIG. 25 shows an embodiment of the amplitude information detector 11. The amplitude information detector 11 comprises a pulse detection circuit 13 comprised of a set/reset type flip-flop FF1 and a master-slave type flip-flop FF2, and a clock generator 12. The clock generator 12 generates a reset signal C2 (see FIG. 24) having short pulses in the neighborhood of the start of one symbol period Ts of the received signal fc, based on the symbol clock C1 synchronized with the received signal fc reproduced by the symbol clock reproducer 8 and generates a capture clock C3 having short pulses in the neighborhood of the completion or end of one symbol period and before the generation of the reset signal C2 indicative of the start of the next symbol.

The pulse signal Dd outputted from the nonlinear amplifier 10 is supplied to a set input terminal S of the set/reset type flip-flop FF1. The reset signal C2 outputted from the clock generator 12 is supplied to a reset input terminal R thereof. Thus, the set/reset type flip-flop FF1 is reset by the reset signal C2 upon the start of one symbol period Ts of the received signal fc, so that an output De is brought to a Low level. When the amplitude of the received signal fc is small and the pulse signal Dd is Low in level, the output signal De is maintained at the Low level. The output De of the Low level is latched in the next-stage master-slave type flip-flop FF2 in response to the capture clock C3 generated in the neighborhood of the completion of one symbol period. An output Df produced from the master-slave type flip-flop FF2 is rendered Low in level.

When the amplitude of the received signal fc is large and the pulse signal Dd is brought to a High level, the set/reset type flip-flop FF1 is set. As a result, the signal De outputted from the set/reset type flip-flop FF1 is changed to the High level and maintained at the High level until the next reset signal is inputted. The output signal of the High level is latched in the next-stage master-slave type flip-flop FF2 in response to the capture clock C3 generated in the neighborhood of the end of one symbol period and the output Df of the master-slave type flip-flop FF2 is rendered High in level (see FIG. 24).

As is apparent from the above description and FIG. 24, the output Df of the master-slave type flip-flop FF2 reaches the High or Low level for each symbol cycle Ts according to the amplitude level of the received signal fc, whereby the amplitude information can be detected. The amplitude information Df detected by the amplitude detection unit 7 in this way is transmitted to the data determinator 5 together with the phase difference information Db detected by the phase detection unit 6.

In response to the symbol clock C1 synchronized with the received signal reproduced by the symbol clock reproducer 8, the data determinator 5 determines the received data from the data obtained by extracting the time of maximum opening of the eye from the phase difference information Db and the amplitude information Df detected by the amplitude detection unit 7 and creates and outputs the demodulated data Dc therefrom. Although not restricted in particular, data expressed in the two rightmost bits are defined as being modulated to phase information and data expressed in one leftmost bit is defined as being modulated to amplitude information. When one bit amplitude information is added to the 2-bit high-order side of the extracted phase information in this condition, the data determinator 5 can obtain demodulated data Dc.

Figure 26:
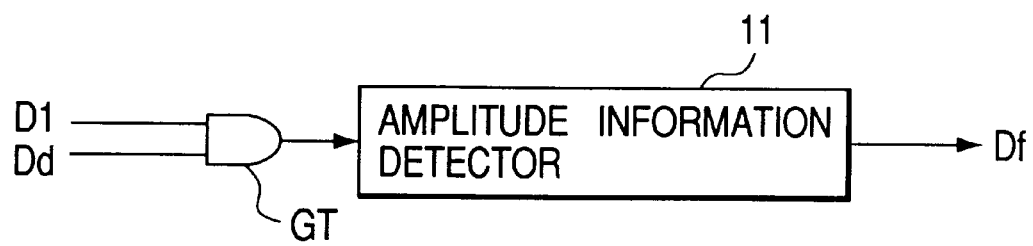
FIG. 26 is a block diagram depicting a modification of the amplitude information detector.

Incidentally, an AND gate circuit GT for ANDing the signal Dd outputted from the nonlinear amplifier 10 and the signal D1 outputted from the nonlinear amplifier 1 of the phase detection unit 6 may be provided on the input side of the amplitude information detector 11 as shown in FIG. 26. Since the signal D1 is also always High in level when the signal Dd is kept at the High level as is apparent from FIG. 24, the provision of the AND gate circuit GT allows the elimination of a noise pulse from the output signal Dd of the nonlinear amplifier 10.

Figure 27:
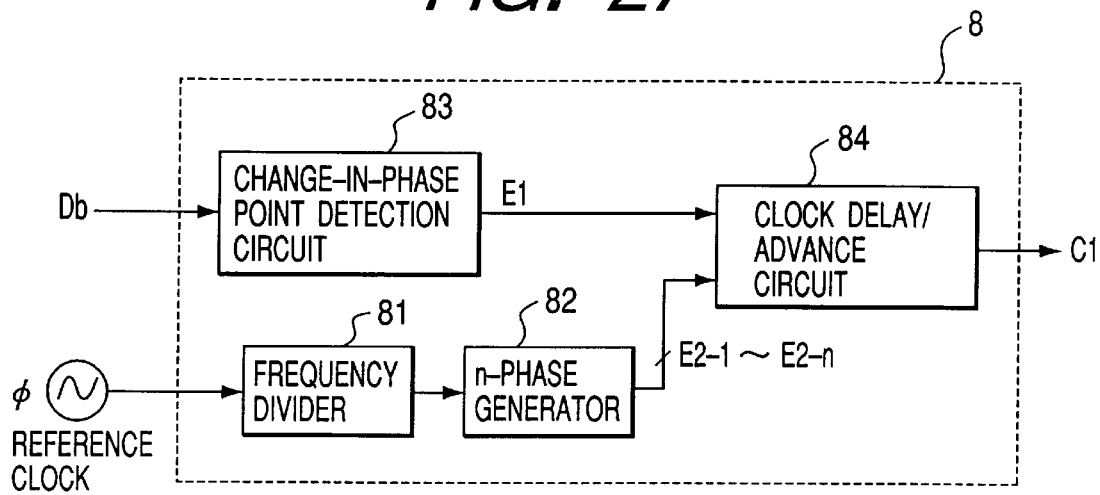
FIG. 27 is a block diagram showing a specific example of a configuration of a symbol clock reproducer.
Figure 28:
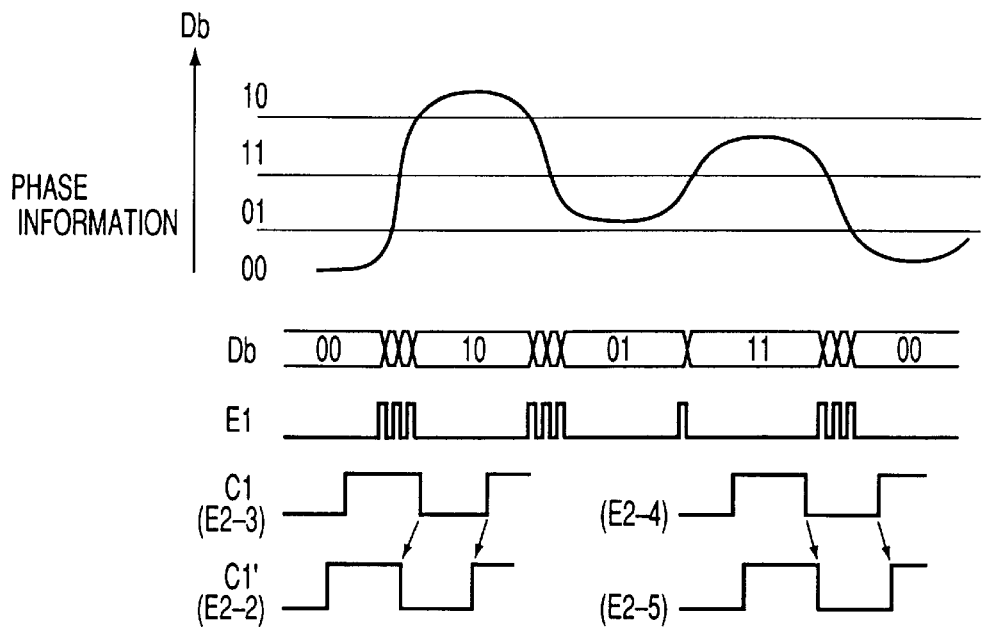
FIG. 28 is a timing chart for describing mutual relations among detected phase information, internal signals of the symbol clock reproducer and outputted symbol clocks.

A specific configurational example of the aforementioned symbol clock reproducer 8 and its operation will next be explained in detail with reference to FIGS. 27 and 28. As shown in FIG. 27, the symbol clock reproducer 8 comprises a frequency divider 81 for frequency-dividing a reference clock φ supplied from the outside, a multiphase generator 82 for generating n multi-phase clocks E2-1 through E2-n shifted in phase from each other from the divided clocks, a change-in-phase point detection circuit 83 for detecting a point of change in phase information from phase difference information Db outputted from the phase detection unit 6 to thereby generate a pulse signal E1 brought to a High level only immediately after the point has changed, and a clock delay/advance circuit 84 for comparing the pulse E1 indicative of the point of change in phase and the n multi-phase clocks E2-1 through E2-n, selecting a clock whose trailing edge substantially coincides with the pulse E1 from the n multi-phase clocks E2-1 through E2-n and outputting it as a symbol clock C1 therefrom.

That is, the clock delay/advance circuit 84 comprises a signal comparator and a selector. As shown as C1 and C' in FIG. 28, when the fall timing of the clock C1 being outputted at present lags behind the point of change in phase, it is changed to a clock C1' faster than the clock C1 in falling timing, whereas when the fall timing of the clock C1 being outputted at present is faster than the point of change in phase, it is changed to a clock C1' slower than the clock C1 in fall timing. Repeating this operation results in the convergence of the trailing edge of C1 on the point of change in phase information. That is, the leading edge of C1 can be allowed to coincide with the time of the maximum opening of the eye. The comparison between the pulse E1 indicative of the change in phase information and the multi-phase clocks E2-1 through E2-n by the clock delay/advance circuit 84 may be performed by making a decision as to whether the pulse E1 is placed within a period in which the multi-phase clocks E2-1 through E2-n are Low in level or a period in which they are High in level.

A description has been made above of the case in which one nonlinear amplifier 10 is provided in the amplitude detection unit 7. However, three or more nonlinear amplifiers having threshold values different from each other may be used so that the accuracy of amplitude information be improved by a combination of results outputted therefrom. Alternatively, when a modulation signal is modulated to three or more amplitude levels and a plurality of pieces of amplitude information are included in one symbol period, a plurality of nonlinear amplifiers corresponding to the number of the amplitude levels can be used to realize accurate demodulation.

Figure 29:
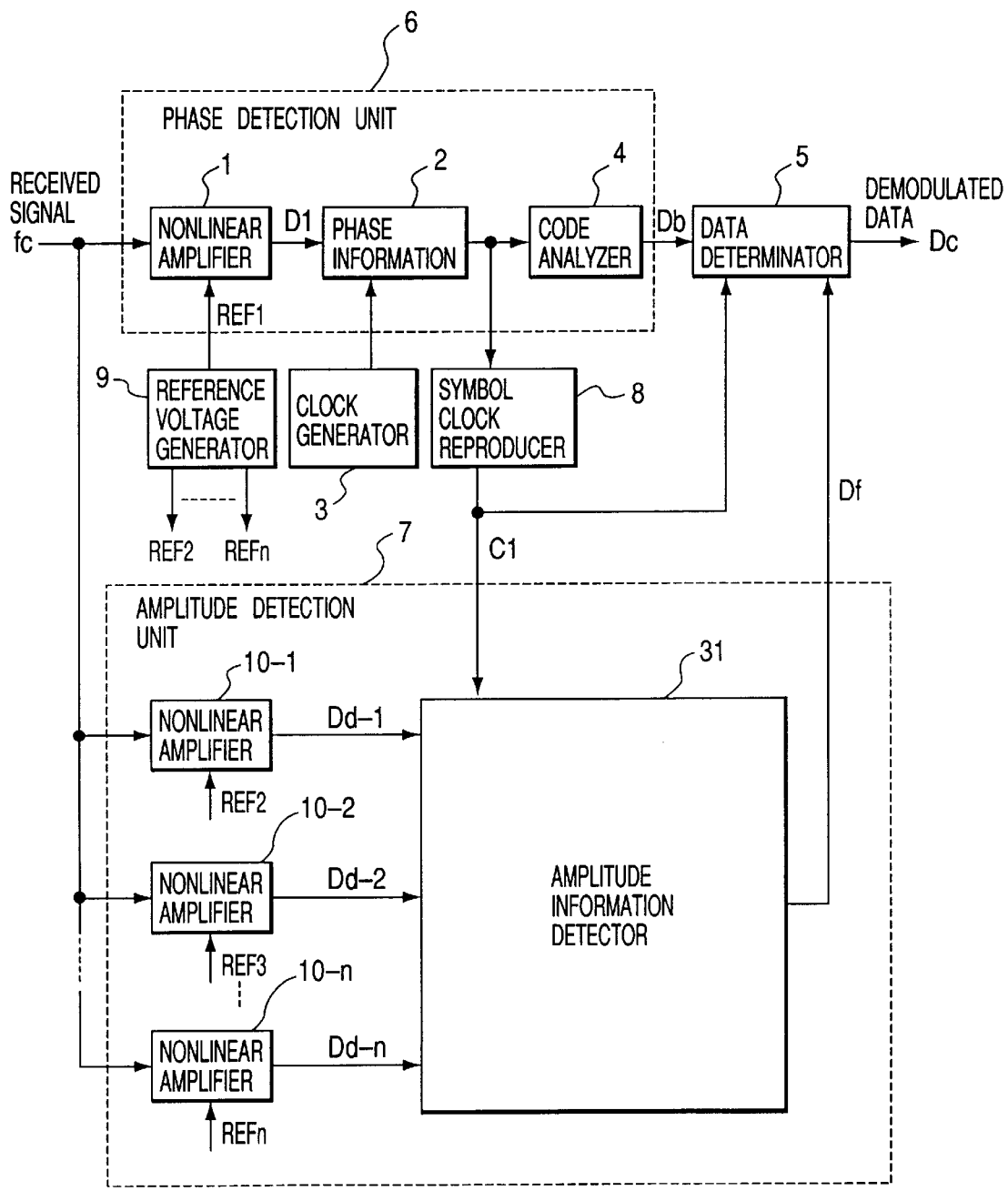
FIG. 29 is a block diagram showing an essential part of a second embodiment of an amplitude phase demodulator to which the technique of the present invention is applied.

FIG. 29 shows a second embodiment of an amplitude phase demodulator. The present embodiment is effective on the case in which an AGC circuit or the like does not provide compensation for a variation in received average power due to fading or the like of a received amplitude phase-modulated signal or the case in which a modulation signal is modulated to three or more amplitude levels.

In the demodulator according to the present embodiment, nonlinear amplifiers 10-1 through 10-n with different values of REF2 through REFn corresponding to amplitude levels defined as threshold values are provided in an amplitude detection unit 7. The plurality of nonlinear amplifiers 10-1 through 10-n amplify a received signal fc and convert the amplified signal into pulse signals Dd-1 through Dd-n, followed by input to an amplitude information detector 31.

Figure 30:
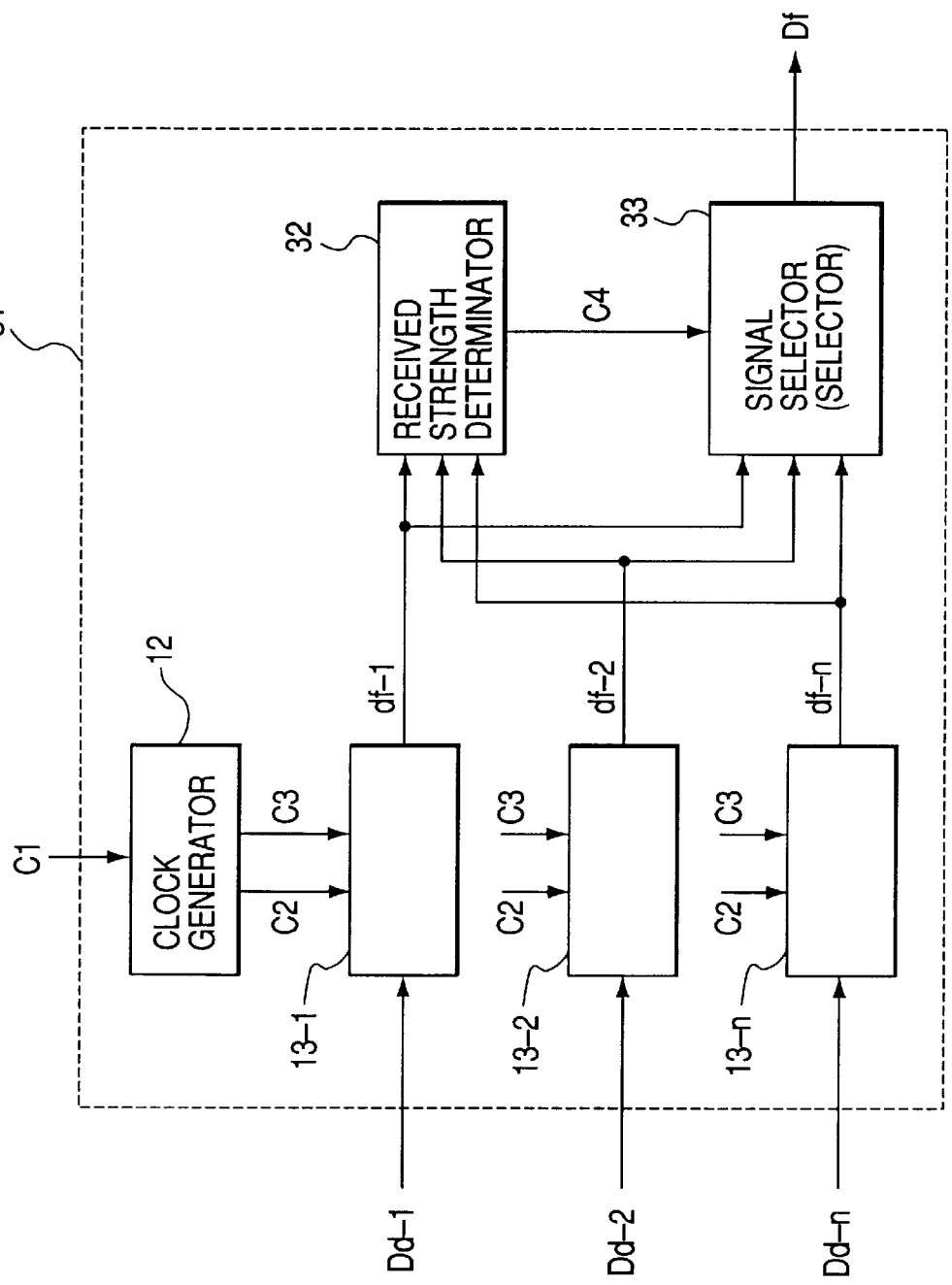
FIG. 30 is a block diagram showing an example of a configuration of an amplitude information detector employed in the second embodiment of the amplitude phase demodulator shown in FIG. 29.

FIG. 30 shows an example of a specific configuration of the amplitude information detector 31 employed in the present embodiment. The amplitude information detector 31 comprises a clock generator 12 similar to that shown in FIG. 25, pulse detection circuits 13-1 through 13-n to which the pulse signals Dd-1 through Dd-n supplied from the nonlinear amplifiers 10-1 through 10-n are inputted respectively, a received strength determinator 32 and a signal selector 33.

The clock generator 12 generates a reset signal C2 in the neighborhood of the start of one symbol cycle or period Ts of the received signal fc, based on a symbol clock C1 synchronized with the received signal reproduced by a symbol clock reproducer 8, generates a capture clock C3 in the neighborhood of the end of one symbol period and before the generation of the reset signal C2 indicative of the start of the next symbol and supplies them to the pulse detection circuits 13-1 through 13-n.

Outputs df-1 through df-n produced from the pulse detection circuits 13-1 through 13-n take or exhibit a High or Low level every symbol periods according to the amplitude level of the received signal fc and threshold values REF2 through REFn supplied to the nonlinear amplifiers 10-1 through 10-n. The outputs df-1 through df-n are supplied to the received strength determinator 32 and the signal selector (selector) 33 respectively. The received strength determinator 32 determines as to the strength of the received signal from the results of fading cyclic periods of df-1 through df-n, outputs a selection signal C4 for selecting a signal amplified to a suitable threshold level from df-1 through df-n and supplies it to the signal selector 33. Described specifically, df high or low in level all during, for example, a predetermined monitoring period is determined as an improper signal, whereas df having both high and low levels is determined as a suitable signal. The signal selector 33 selects a signal designated or specified from the outputs df-1 through df-n of the pulse detection circuits 13-1 through 13-n in accordance with the above-described selection signal C3 and sends it to the data determinator 5 as amplitude information Df.

In response to the symbol clock C1 synchronized with the received signal reproduced by the symbol clock reproducer 8, the data determinator 5 forms and outputs demodulated data Dc from the data obtained by extracting the time of maximum opening of the eye from the phase difference information Db and the amplitude information Df detected by the amplitude detection unit 7. According to the present embodiment, the function of the AGC circuit can be also implemented in digital form.

Further, the demodulated data Dc may be formed after the input signal is converted into orthogonal or rectangular coordinates from the phase information and the amplitude information and the rectangular coordinates are subjected to a process such as waveform equalization or the like.

FIG. 31 shows another application of the demodulator according to the present invention. The application shown in the same drawing is a satellite communication system. Transmit data is compressed by each of compressors 41 and modulated by each of QAM modulators 42. Thereafter, the transmit data for a plurality of channels are multiplexed by a frequency multiplexer 43, which in turn are sent to a satellite 45 through an antenna 44. On the other hand, data oscillated or transmitted from the satellite 45 is received by an antenna 44 and subjected to frequency separation by a frequency separator 46. Thereafter, the separated data is demodulated by each of demodulators 47 and expanded by each of expanders 48, whereby the expanded data is restored to received or receive data.

The invention made by the present inventors has been described above specifically by the embodiments. However, the present invention is not necessarily limited to the aforementioned embodiments. It is needless to say that various changes can be made thereto within the scope departing from the gist or substance thereof.

For example, a BBS (Bucket Brigade Device) delay circuit may be used as a shift register.

The above description has been made principally of the case in which the invention made by the present inventors is applied to the mobile communication device or satellite communication system corresponding to an application field defined as its background. However, the present invention is not limited to this. The present invention can be applied even to wired or cable data communications, for example.

INDUSTRIAL APPLICABILITY

Advantageous effects of typical ones of the inventions disclosed in the present application will be described briefly as follows:

That is, a process for digitally demodulating a phase-modulated signal can be realized in a simple and small-scale structure or configuration suitable for semiconductor integration and a reduction in cost and in a configuration easy to provide speed-up and high accuracy without the use of a high-speed and high-resolution A/D converter.

After a received amplitude phase-modulated signal has been pulsated by a plurality of nonlinear amplifiers different in threshold value from each other, all the processing functions of a phase detector, an amplitude detector, etc. can be constructed of digital circuits. Therefore, analog circuits can be implemented only by nonlinear amplifiers and a principal part can be realized by digital circuits suitable for semiconductor integration and process miniaturization. Thus, an amplitude phase demodulator, which eliminates the need for a complex process such as orthogonal or quadrature detection or the like and is suitable for a reduction in cost, can be obtained.

Further, the implementation of a demodulator in a system using a high-frequency carrier signal in digital form by a conventional system needs a sampling clock signal whose frequency is higher than that of the carrier signal, thus resulting in an increase in power consumption. However, the application of the present invention allows detection of phase information on a received modulated signal without using the high-frequency sampling clock signal.

What is claimed is:

1. A phase demodulator comprising:
    sampling means for periodically sampling logical values of a phase-modulated signal waveform-shaped into a binary pulse signal to thereby generate a serial code train;
    serial/parallel converting means for converting the serial code train into a parallel code train of a predetermined bit length for each predetermined interval;
    code analyzing means for logically detecting phase difference information, based on a logical pattern displacement on a time sequence of the parallel code train;
    data determining means for generating demodulated data, based on the output of said code analyzing means; and
    a clock generator having a period different from a carrier period of the phase-modulated signal and a period which stands in integer ratio relationship to the carrier period and wherein logical values of the phase modulated signal are sampled in synchronism with a clock signal outputted from said clock generator.

2. A phase demodulator according to claim 1, further including a shift register for serially shift-transmitting the logical values of the phase-modulated signal waveform-shaped into the binary pulse signal in synchronism with said sampling clock signal and wherein said sampling means and said serial/parallel converting means are made up of the shift register.

3. A phase demodulator comprising:
    sampling means for periodically sampling logical values of a phase-modulated signal waveform-shaped into a binary pulse signal to thereby generate a serial code train;
    serial/parallel converting means for converting the serial code train into a parallel code train of a predetermined bit length for each predetermined interval;
    code analyzing means for logically detecting phase difference information, based on a logical pattern displacement on a time sequence of the parallel code train;
    data determining means for generating demodulated data, based on the output of said code analyzing means;
    said sampling means and said converting means including a plurality of shift registers to which the phase-modulated signal is inputted in common and which respectively output the parallel code train; and
    a multi-phase clock generator for distributing clock signals identical in period to each other and different in phase from each other to said respective shift registers.

4. A phase demodulator according to claim 3, wherein said shift registers serially shift-transmit the logical values of the phase-modulated signal waveform-shaped into the binary pulse signal in synchronism with said clock signals.

5. A phase demodulator according to claim 4, wherein said clock generator has a period different from a carrier period of the phase-modulated signal and a period which stands in integer ratio relationship to the carrier period; and
    wherein said sampling means samples logical values of the phase modulated signal in synchronism with said clock signals.

6. A phase demodulator comprising:
    sampling means for periodically sampling logical values of a phase-modulated signal waveform-shaped into a binary pulse signal to thereby generate a serial code train;
    serial/parallel converting means for converting the serial code train into a parallel code train of a predetermined bit length for each predetermined interval;
    code analyzing means for logically detecting phase difference information, based on a logical pattern displacement on a time sequence of the parallel code train;
    data determining means for generating demodulated data, based on the output of said code analyzing means;
    said sampling means including a frequency divider for by-½ dividing the phase-modulated signal to produce a divided phase modulated signal; and
    wherein said sampling means and converting means perform a process for sampling logical values of a phase-modulated signal by-½ divided by said frequency divider and performing serial/parallel conversion on them.

7. A phase demodulator according to claim 6, further including a clock generator having a period different from a carrier period of the phase-modulated signal and a period which stands in integer ratio relationship to the carrier period and outputting a clock signal to said sampling means, wherein said sampling means samples logical values of the divided phase modulated signal in synchronism with the clock signal.

8. A phase demodulator according to claim 6, further including
    said sampling means and said converting means including a plurality of shift registers to which the phase-modulated signal is inputted in common and which respectively output the parallel code train; and
    a multi-phase clock generator for distributing clock signals identical in period to each other and different in phase from each other to said respective ones of said shift registers.

9. An amplitude phase demodulator comprising:
    a phase detection unit for detecting a phase component of a received amplitude phase-modulated signal;
    an amplitude detection unit for detecting an amplitude component of the received amplitude phase-modulated signal;
    a data determinator for determining received data from the output of said phase detection unit and the output of said amplitude detection unit;
    a symbol clock reproducer for reproducing a symbol clock synchronized with the received signal from the output of said phase detection unit;
    said amplitude detection unit waveform-shaping the received signal into a binary pulse signal using a nonlinear amplifier having one or two or more different threshold values and determining the presence or absence of the pulse signal, thereby detecting amplitude information; and
    said amplitude detection unit comprising a received strength determinator for determining a received strength from a plurality of pieces of amplitude information each having been determined as to the presence or absence of a pulse signal, which are produced from outputs of nonlinear amplifiers each having one or more different threshold values, and a signal selector for selecting the optimum amplitude information from the plurality of pieces of amplitude information, based on the result of determination by said received strength determinator.

10. An amplitude phase demodulator according to claim 9, wherein said phase detection unit comprises a nonlinear amplifier for bringing a received signal into a binary pulse signal and a phase information detector.

11. An amplitude phase demodulator according to claim 9, wherein said phase detection unit comprises a nonlinear amplifier for bringing a received signal into a binary pulse signal and a phase information detector, and said nonlinear amplifier of said phase detection unit waveform-shapes the received signal into the binary pulse signal and determines the pulse signal to thereby detect phase information.

12. An amplitude phase demodulator comprising:
 a phase detection unit for detecting a phase component of a received amplitude phase-modulated signal;
 an amplitude detection unit for detecting an amplitude component of the received amplitude phase-modulated signal;
 a data determinator for determining received data from the output of said phase detection unit and the output of said amplitude detection unit;
 a symbol clock reproducer for reproducing a symbol clock synchronized with the received signal from the output of said phase detection unit;
 said amplitude detection unit waveform-shaping the received signal into a binary pulse signal using a nonlinear amplifier having one or two or more different threshold values and determining the presence or absence of the pulse signal, thereby detecting amplitude information; and
 a set/reset type flip-flop reset for each symbol reproduced by said symbol clock reproducer that makes a decision as to the presence or absence of the pulse signal to thereby detect amplitude information.

13. An amplitude phase demodulator according to claim 12, wherein said phase detection unit comprises a nonlinear amplifier for bringing a received signal into a binary pulse signal and a phase information detector, and said nonlinear amplifier of said phase detection unit waveform-shapes the received signal into the binary pulse signal and determines the pulse signal to thereby detect phase information.

14. An amplitude phase demodulator according to claim 12, further including
 said amplitude detection unit comprising a received strength determinator for determining a received strength from a plurality of pieces of amplitude information each having been determined as to the presence or absence of a pulse signal, which are produced from outputs of nonlinear amplifiers each having one or more different threshold values, and a signal selector for selecting the optimum amplitude information from the plurality of pieces of amplitude information, based on the result of determination by said received strength determinator.

15. An amplitude phase demodulator according to claim 14, wherein said phase detection unit comprises a nonlinear amplifier for bringing a received signal into a binary pulse signal and a phase information detector, and said nonlinear amplifier of said phase detection unit waveform-shapes the received signal into the binary pulse signal and determines the pulse signal to thereby detect phase information.

16. An amplitude phase demodulator according to claim 12, wherein said phase detection unit comprises a nonlinear amplifier for bringing a received signal into a binary pulse signal and a phase information detector.

17. An amplitude phase demodulator according to claim 16, further including
 said amplitude detection unit comprising a received strength determinator for determining a received strength from a plurality of pieces of amplitude information each having been determined as to the presence or absence of a pulse signal, which are produced from outputs of nonlinear amplifiers each having one or more different threshold values, and a signal selector for selecting the optimum amplitude information from the plurality of pieces of amplitude information, based on the result of determination by said received strength determinator.

18. An amplitude phase demodulator according to claim 17, wherein said nonlinear amplifier of said phase detection unit waveform-shapes the received signal into the binary pulse signal and determines the pulse signal to thereby detect phase information.

19. An amplitude phase demodulator according to claim 16, wherein said nonlinear amplifier of said phase detection unit waveform-shapes the received signal into the binary pulse signal and determines the pulse signal to thereby detect phase information.

* * * * *